United States Patent
Sakimura et al.

(10) Patent No.: US 6,795,340 B2
(45) Date of Patent: Sep. 21, 2004

(54) NON-VOLATILE MAGNETIC MEMORY

(75) Inventors: Noboru Sakimura, Tokyo (JP); Takeshi Honda, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/336,710

(22) Filed: Jan. 6, 2003

(65) Prior Publication Data

US 2003/0128579 A1 Jul. 10, 2003

(30) Foreign Application Priority Data

Jan. 10, 2002 (JP) ...................................... 2002-003728

(51) Int. Cl.[7] .............................................. G11C 11/14
(52) U.S. Cl. ........................ 365/171; 365/173; 365/158
(58) Field of Search ............................. 365/1, 2, 6, 55, 365/158, 171, 173, 232

(56) References Cited

U.S. PATENT DOCUMENTS 5,640,343 A * 6/1997 Gallagher et al. .......... 365/171
6,643,168 B2 * 11/2003 Okazawa .................... 365/173

OTHER PUBLICATIONS

2000 IEEE International Solid State Circuits Conference, pp. 128–129, ISSCC/ 2000 Session/TD; Emerging Memory & Device Technologies/Paper TA7.2.

Applied Physics letters vol. 77, No. 13, Sep. 25, 2000, pp. 1–3, Frank Z. Wang, Diode–free magnetic random access memory using spin–dependent tunneling effect.

* cited by examiner

Primary Examiner—David Nhu
(74) Attorney, Agent, or Firm—Young & Thompson

(57) ABSTRACT

A pair of memory elements form a unit cell and these elements are magnetized in opposite directions. At the time of read a voltage of V1 is applied to a word line WL0 and a voltage of V2 is applied to the word line/WL0. Further a specific bit line is connected to a read circuit 22 and the bit line is virtually grounded to Vg=(V1+V2)/2. Therefore, current Is passed through the bit line is as follows: Is=Vs·(Rb−Ra)/(Ra·Rb), wherein the resistance value of the memory element 1a is Ra, the resistance value of the memory element 1b is Rb. Thus, if a direction of the current is detected by the read circuit, information written in the unit cell can be read. Thus, a non-volatile magnetic memory whose cell configuration is simple, and which can be integrated with high density and has a read circuit having a small surface area and low power consumption, can be obtained.

42 Claims, 28 Drawing Sheets

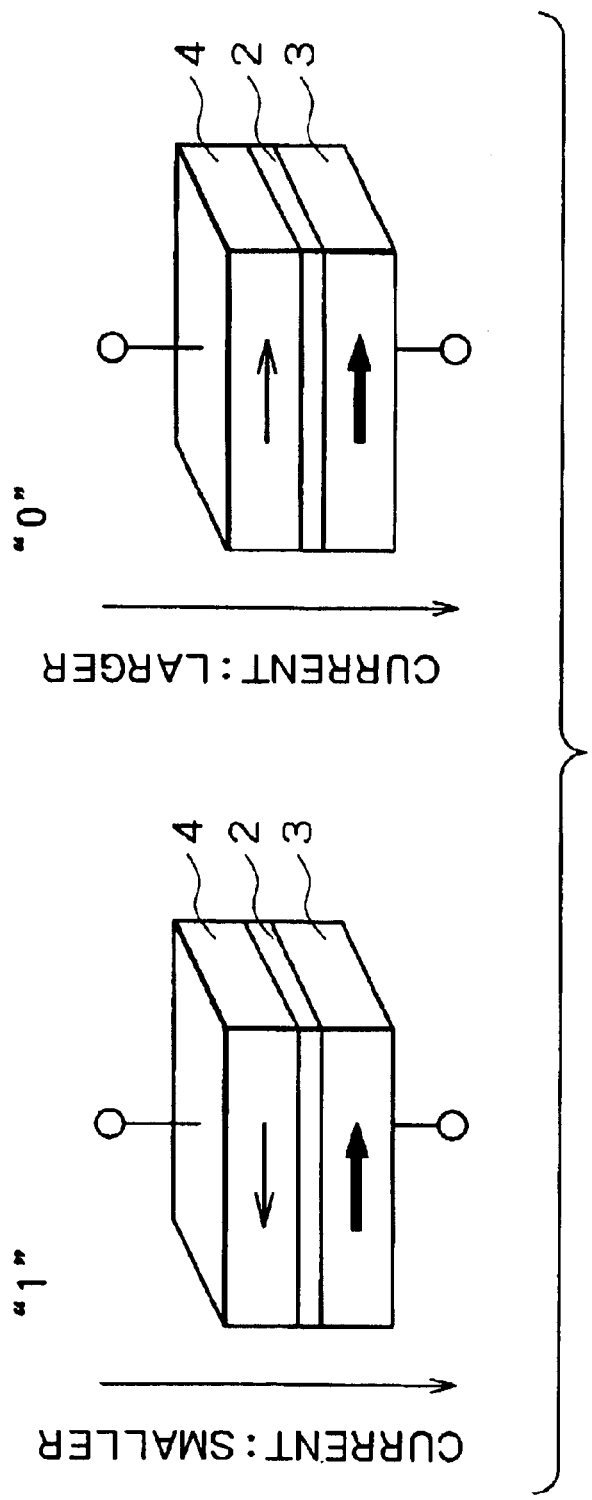

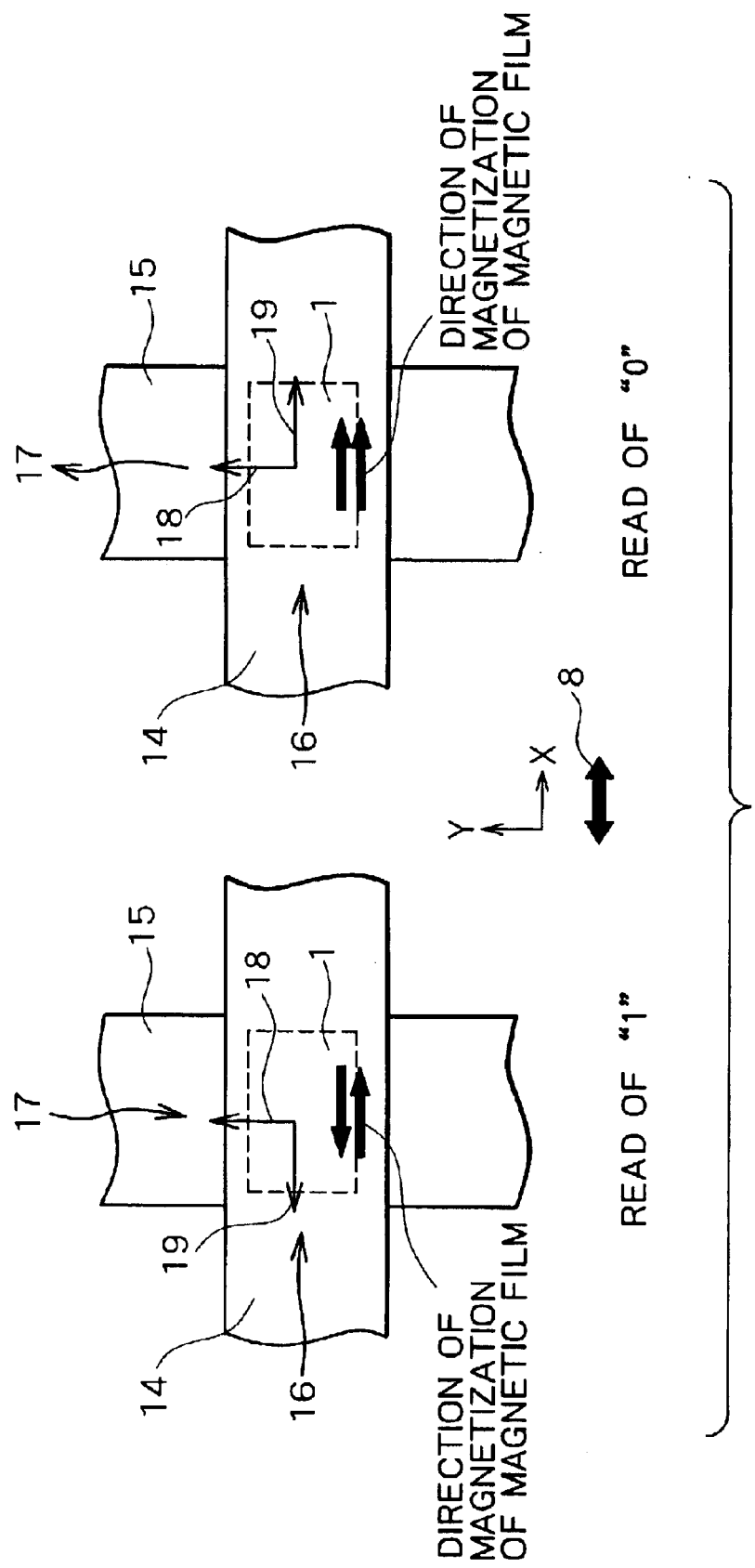

FIG. 7 (PRIOR ART)

READ OF "unknown" (FIRST READ)

↓

WRITE OF "0" (FIRST WRITE)

↓

READ OF "0" (SECOND READ)

↓

COMPARISON BETWEEN "0" AND "unknown"

"0" ≒ "unknown" ↙ ↘ "0" ≪ "unknown"

"0" OUTPUT    "1" OUTPUT

↘ ↙

REWRITE (SECOND WRITE)

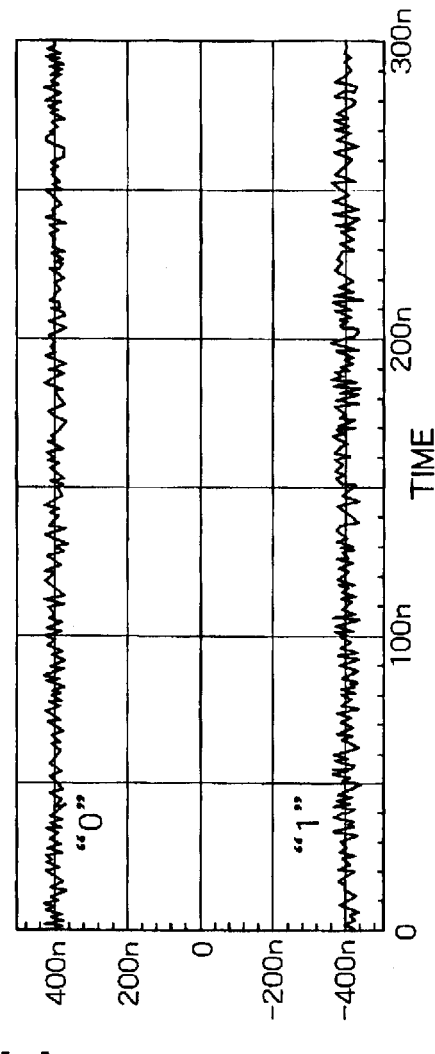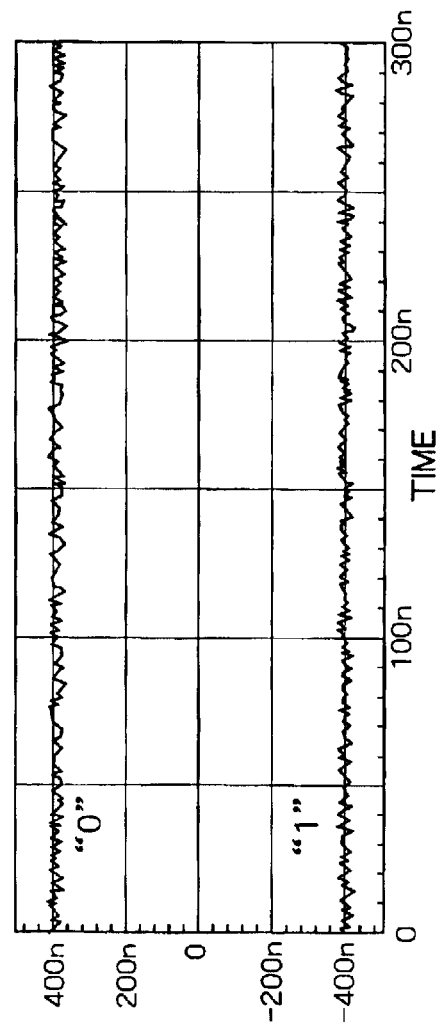
FIG.21A
FIG.21B

NON-VOLATILE MAGNETIC MEMORY

BACKGROUND OF THE INVENTION

1. Technical Field of the Invention

The present invention relates to a non-volatile magnetic memory using a tunnel magnetic resistor and a method for reading its information.

2. Description of the Related Art

A non-volatile magnetic memory using a Tunnel Magnetic Resistor (TMR) as a memory element is called as a Magnetic Random Access Memory (MRAM). FIG. 1 is a schematic view showing one example of a structure of TMR. In this example of TMR, an insulating film 2 having a thickness of about 2 nm is provided on a ferromagnetic film of a pin layer 3 having a thickness of about 20 nm. Further, a ferromagnetic film of a free layer 4 having a thickness of about 20 nm is provided on the insulating film 2. A direction of the magnetization in the pin layer 3 is fixed, and "1" or "0" is determined by use of a characteristics that the tunnel current is changed by the fact that a direction of magnetization in the free layer 4 is same direction (parallel) or the opposite direction (nonparallel) to that in the pin layer 3, that is a change in the resistance value.

Further, as shown in FIG. 2, electric current is respectively passed through a first wiring 14 and a second wiring 15 intersecting to each other, which were provided on and below the TMR 1 and the magnetization direction of the free layer 4 is inverted by a combined magnetic field produced by the current on the TMR 1 so that information of "1" or "0" can be written. For example, assuming that an easy axis 8 of magnetization in the TMR 1 is a direction of X in FIG. 2, when a direction of the second electric current 17 passed through the second wiring 15 extending to the direction of Y is a negative direction in the Y axis, writing of "1" can be performed on the other hand, when the direction of the second electric current 17 is a positive direction, writing of "0" can be performed. In the case of this example, the first electric current 16 in the first wiring 14 extending to the direction of X may be passed to any direction with respect to the X-axis.

FIGS. 3A and 3B show an example of a memory cell using a TMR. A one side terminal of TMR 1 is connected to a bit line 11 and the other side terminal is connected to a transistor 6. The selection of the cell is carried out by applying high voltage to a reading word line 13 to turn the transistor 6 ON (on electrical continuity conditions). Here, when an arbitrary voltage is applied to a bit line 11, different current is passed from the bit line 11 to Gnd through TMR 1 on the conditions of "1" or "0". By measuring this current a reading operation is performed. A write operation is performed by making the transistor 6 off (electrical non-continuity conditions) and passing current to a writing word line 12 and the bit line 11 respectively. In this example of the memory cell, the bit line 11 is used in writing and reading in common. However, since TMR 1 is connected to the transistor 6 the word line is distributed to the writing word line 12 and the reading word line 13. As shown in FIG. 3B, since the writing word line 12 must be placed just below (or just above) TMR 1, a leading wiring 7 is required to connect the transistor 6 formed on a Si substrate with TMR 1.

FIG. 4 is a configuration of a MRAM described in "2000 IEEE International Solid-State Circuits Conference pp 128–129". In this example, memory cells shown in FIGS. 3A and 3B are arranged in a matrix to form a cell array. Two adjacent memory cells on a word line are set to one unit cell 5 and this example is characterized in that information is complementarily read from or written in the respective TMRs in the unit cell 5. It is noted that an easy axis 8 of magnetization in each TMR is parallel to the direction of the word line. For example, when writing to the unit cell 5 is performed, a reading word line 13a is made low and transistors 6a, 6b are turned off, and electric current is passed through a writing word line 12a in an arbitrary direction and at the same time electric current is passed through a bit line 11a and a bit line 11b in different directions respectively so that complementary writing is carried out. The read operation is carried out by setting the reading word line 13a to a high mode, turning the transistors 6a, 6b on, selecting the bit lines 11a, 11b with a Y selector 21 to connect it to a read circuit 22, and applying the same voltage to the bit line 11a and the bit line 11b to detect the difference of current passed thorough TMRs 1a, 1b.

FIGS. 5A and 5B shows another example of a memory cell using a TMR. One side terminal of TMR 1 is connected to a word line 10 and the other side terminal is connected to a bit line 11. Here, an easy axis 8 of magnetization in TMR 1 is parallel to the direction of the word line. Then writing to a cell is carried out by passing electric current 16 through the word line 10 in an arbitrary direction, and passing electric current 17 through the bit line 11 in a positive direction or a negative direction with respect to the direction of Y-axis in accordance with information to be written. Further, reading is carried out by applying arbitrary fixed voltage to the word line 10 and the bit line 11 and detecting values of current 23 passing through TMR 1. In this example of the memory cell the word line 10 and the bit line 11 are used in reading and writing in common.

FIG. 6 is a configuration of a MRAM described in a prior reference "Applied Phisics Letters Vol. 77 Num. 13, 2000. 9. 25". In this example, a memory cell shown in FIGS. 5A and 5B is defined as a unit cell 5, and the unit cells 5 are arranged in a matrix to form a cell array. Here, the easy axis of magnetization in each TMR is parallel to the word line. Then writing to the cell 5 is carried out by passing electric current through a word line 10a in an arbitrary direction, and at the same time by passing electric current through a bit line 11a in a positive direction or a negative direction with respect to the direction of Y-axis in accordance with information to be written. Reading of information written in the cell 5 is carried out as follows. First, an arbitrary voltage V1 is applied to the word line 10a and 0 V is applied (connected to Gnd) to other word lines 10b and 10c other than the word line 10a. Then the bit line 11a is connected to a read circuit 22 and 0 V is applied (connected to Gnd) to the bit lines 11b and 11c other than the bit line 11a. At that time the bit line 11a is a virtual earth terminal and the voltage 10 of the bit line 11a becomes 0 V. A voltage of V1 is applied across TMR 1a and electric current 23 according to information stored in the cell 5 flows in the bit line 11a so that the current is input into the read circuit 22.

The read circuit 22 reads information with a self-reference system in which the information in the cell 5 is read twice and a current value read first is compared with a read current value of the second known information as shown in FIG. 7.

A transistor is added to each TMR in MRAM of FIG. 4 shown as a conventional example. Thus, since the selectivity of the cell is excellent and current flowing in TMR is read by complementation (difference), signal is doubled. However, since these transistors can be mounted on only Si substrate, a leading wiring 7 shown in FIG. 3B is needed and the cell size is not decreased. Further, these transistors are arranged in the cell array and no peripheral circuits such as a selector, a read circuit and the like can be arranged. Even if the scaling of the TMR size is advanced, the cell size is restrained by the design rule of the base elements including a transistor. Further, the presence of this leading wiring 7 increases the distance between the writing word line 12 and TMR 1. Since magnetic fields 18, 19 produced by the write current on TMR 1 is inversely proportional to this distance, the current value for producing a magnetic field (inverted field) required for inversion of magnetization is remarkably increased.

In MRAM of FIG. 6 shown as a conventional example the configurations of the respective cells are simple and the cell size becomes small. Thus, since the word line 10 and the bit line 11 can be formed with a very near distance to TMR 1, the current value during writing can be comparatively decreased. Further, peripheral circuits such as a selector, a read circuit and the like can be arranged in the cell array. However, in this example the selectivity of the cell is bad and the signal-to-noise ratio is deteriorated by the sneak current from the non-selective cell. That is when noise is interposed between the word lines 10b, 10c and the bit line 11a of FIG. 6, a minute sneak current flows through TMRs 1b, 1c and the current is input into the read circuit 22. The more the array size is increased the more the sum of the sneak currents is increased. For example, if a resistance value of TMR having information of "1" is 100 kΩ and a resistance value of TMR having information of "0" is 110 kΩ, and a voltage of 0.5 V is applied across TMR, the read current values reaches 5 $\mu$A and 4.2 $\mu$A. When noise of 1 mV is interposed between the bit line 11a and the word lines 10b, 10c . . . in a 64×64 array, the sum of the sneak currents reach 0.6 $\mu$A, which is substantially equal to the difference between the above-mentioned current values.

Further, since in this example the information of the cell is read by a self-reference system containing twice read operation and twice write operation as shown in FIG. 7, read time is increased. Further, by the reasons that the ratio of a resistance value of a TMR in parallel direction of magnetization to a resistance value of a TMR in nonparallel direction of magnetization (hereinafter referred to as MR ratio) is 10% to 20%, which is not so large, the selectivity of the above-mentioned cell is bad, the absolute value of a read current value must be measured and that the first read result must be stored, the read circuits are complicated and the circuit scale and power consumption is also increased. FIG. 8 is an example of a read circuit, which is operated based on a self-reference system. An offset current subtractor 30 removes an offset component in a signal current, which flows in a selective bit line 11a and a noise current removing filter 26 removes a high-frequency component in the above-mentioned sneak current and the like thereby to improve the signal-to-noise ratio. Further, the output signal of the noise current removing filter 26 is digitized by an AD converter 27 and the first read result is stored in a register 28. The read current during the second read is also digitized and the first read result and the second read result are compared with each other by a 1/0 determining circuit 29 thereby to perform the output of "1" or "0". In this case, when the noise current removing filter 26 is realized by an integrator, integration time of about a few $\mu$sec is required for the removal of noise. When as the AD converter 27 an 8 bit parallel type AD converter is used, a sample hold circuit, an encoder as well as 255 comparators are needed. Further, the register 28 needs a D type flip-flop or the like having the output bit number of the AD converter is needed and the 1/0 determining circuit 29 also needs several adders and subtractors.

SUMMARY OF THE INVENTION

The object of the present invention is to provide a non-volatile magnetic memory whose cell configuration is simple and which can be densely integrated and includes a read circuit having a small surface area and low power consumption.

A non-volatile magnetic memory according to a first aspect of the present invention comprises a cell array including a plurality of unit cells arranged in a matrix. The unit cell includes a first word line; a first memory element connected to the first word line and having an insulating film and at least two-layered ferromagnetic films provided so as to sandwich the insulating film therebetween; a second word line; a second memory element connected to the second word line and having an insulating film and at least two-layered ferromagnetic films provided so as to sandwich the insulating film therebetween; and a bit line connected to the first memory element and the second memory element and intersecting with the first word line and the second word line. Further the non-volatile magnetic memory comprises an information read part, which reads information from the first memory element and the second memory element by use of the fact that a tunnel electric current is changed by the conditions of a direction of magnetization in the at least two-layered ferromagnetic films. In the non-volatile magnetic memory the directions of easy axis of magnetization in the first memory element and the second memory element are the same as the direction of the bit line and the first memory element and the second memory element store information opposite to each other.

This non-volatile magnetic memory according to the first invention may further comprises a first voltage applying part for applying an arbitrary voltage V1 to the first word line in the read unit cell at the time of read; a second voltage applying part for applying an arbitrary voltage V2 different from the voltage V1 to the second word line in the read unit cell at the time of read; a connecting part for applying a voltage Vg expressed by Vg=(V1+V2)/2 to the bit line in the read unit cell and connecting the bit line in the read unit cell to the information read part at the time of read; and a disconnecting part for disconnecting a word line in the cell array other than the first word line and the second word line in the read unit cell and a bit line in the cell array other than the bit line in the read unit cell from the information read part at the time of read. The information read part may read information written in the read unit cell by detecting a direction of electric current, which flows into the bit line in the read unit cell.

The non-volatile magnetic memory according to the first invention may further comprise a first wiring having the voltage V1; a second wiring having the voltage V2; a third wiring having the voltage Vg; and a connecting part for connecting a bit line in the cell array other than the bit line in the read unit cell to the third wiring at the time of read. The first voltage applying part may connect the first word line in the read unit cell to the first wiring, and the second voltage applying part may connect the second word line in the read unit cell to the second wiring.

The non-volatile magnetic memory according to the first invention may further comprise a first voltage applying part for applying an arbitrary voltage V1 to the first word line in a read unit cell at the time of read; a second voltage applying part for applying an arbitrary voltage V2 different from the voltage V1 to the second word line in the read unit cell at the time of read; a connecting part for applying a voltage Vg expressed by Vg=(V1+V2)/2 to the bit line in the read unit cell and connecting the bit line in the read unit cell to the information read part at the time of read; an opening part for opening a word line in the cell array other than the first word line and the second word line in the read unit cell at the time of read; and a disconnecting part for disconnecting a bit line in the cell array other than the bit line in the read unit cell from the information read part at the time of read. The information read part may read information written in the read unit cell by detecting a direction of electric current, which flows into the bit line in the read unit cell.

The non-volatile magnetic memory according to the first invention may further comprise a first wiring having the voltage V1; and a second wiring having the voltage V2. The first voltage applying part may connect the first word line in the read unit cell to the first wiring, and the second voltage applying part may connect the second word line in the read unit cell to the second wiring.

In the non-volatile magnetic memory according to the first invention, the information read part may be provided in every bit line and information may be simultaneously read from a plurality of unit cells connected to the same word line.

The non-volatile magnetic memory according to the first invention may further comprise an information write part for passing electric current in bi-direction different from both the first word line and the second word line in a read unit cell.

A non-volatile magnetic memory according to a second invention comprises a cell array including a plurality of unit cells arranged in a matrix, and a plurality of reference cells arranged in a line. The unit cell includes a word line; a memory element connected to the word line and having an insulating film and at least two-layered ferromagnetic films provided so as to sandwich the insulating film therebetween; and a bit line connected to the memory element and intersecting with the word line. The reference cell includes a word line; a resistance element connected to the word line; and a bit line connected to the resistance element and intersecting with the word line. The non-volatile memory comprises an information read part, which reads information from the memory element by use of the fact that a tunnel electric current is changed by the conditions of a direction of magnetization in the at least two-layered ferromagnetic films. In the non-volatile memory, the direction of easy axis of magnetization in the memory element is the same as the direction of the bit line.

In the non-volatile magnetic memory according to the second invention a resistance value of the resistance element may be an intermediate value between a resistance value in the conditions where the memory element stores "0" and a resistance value in the conditions where the memory element stores "1".

In the non-volatile magnetic memory according to the second invention the cell array may include a plurality of reference lines each having the plurality of reference cells; and the reference cell having both a read unit cell and a bit line and belonging to the reference line, which is nearest to the line to which the read unit cell belongs, may be utilized for the read of information from the read unit cell.

The non-volatile magnetic memory according to the second invention may further comprise a first voltage applying part for applying an arbitrary voltage V1 to the word line in a read unit cell at the time of read; a second voltage applying part for applying an arbitrary voltage V2 different from the voltage V1 to the word line in an usage reference cell at the time of read; a connecting part for applying a voltage Vg expressed by $Vg=(V1+V2)/2$ to the bit line of both the read unit cell and the usage reference cell and connecting a bit line of both the read unit cell and the usage reference cell to the information read part at the time of read; a disconnecting part for disconnecting a word line in the cell array other than the word line in the read unit cell and the word line in the usage reference cell, and a bit line in the cell array other than the bit lines of both the read unit cell and the usage reference cell from the information read part at the time of read. In the non-volatile memory the information read part may read information written in the read unit cell by detecting a direction of electric current, which flows into a bit line of both the read unit cell and the usage reference cell.

The non-volatile magnetic memory according to the second invention may further comprise a first wiring having the voltage V1; a second wiring having the voltage V2; a third wiring having the voltage Vg; and a connecting part for connecting a bit line in the cell array other than the bit line of both the read unit cell and the usage reference cell to the third wiring at the time of read. The first voltage applying part may connect the word line in the read unit cell to the first wiring, and the second voltage applying part may connect the word line in the usage reference cell to the second wiring.

The non-volatile magnetic memory according to the second invention may further comprise a first voltage applying part for applying an arbitrary voltage V1 to the word line in a read unit cell at the time of read; a second voltage applying part for applying an arbitrary voltage V2 different from the voltage V1 to the word line in an usage reference cell at the time of read; a connecting part for applying a voltage Vg expressed by $Vg=(V1+V2)/2$ to the bit line of both the read unit cell and the usage reference cell and connecting the bit line of both the read unit cell and the usage reference cell to the information read part at the time of read; an opening part for opening a word line in the cell array other than the word line in the read unit cell and a word line in the usage reference cell at the time of read; and a disconnecting part for disconnecting a bit line in the cell array other than the bit line of both the read unit cell and the usage reference cell from the information read part at the time of read. The information read part may read information written in the read unit cell by detecting a direction of electric current, which flows into the bit line of both the read unit cell and the usage reference cell.

The non-volatile magnetic memory according to the second invention may further comprise a first wiring having the voltage V1; and a second wiring having the voltage V2. The first voltage applying part may connect the word line in the read unit cell to the first wiring, and the second voltage applying part may connect the word line in the usage reference cell to the second wiring.

In the non-volatile magnetic memory according to the second invention, the information read part may be provided in every bit line and information may be simultaneously read from a plurality of unit cells connected to the same word line.

The non-volatile magnetic memory according to the first and second inventions may include a voltage source, which produces the voltage V1, the voltage V2 and the voltage Vg.

The non-volatile magnetic memory according to the first and second inventions may include a terminal circuit for connecting all word lines and all bit lines to a wiring of the voltage Vg at the time other than the time of read and the time of write.

The non-volatile magnetic memory according to the first invention may include a terminal circuit for connecting the first word line and the second word line in a selection unit cell and a bit line in the selection unit cell to a wiring having the voltage Vg, and disconnecting other word lines and other bit lines in the cell array from a wiring having the voltage Vg at the time of write.

The non-volatile magnetic memory according to the second invention may include a terminal circuit for connecting the word line in the selection unit cell, the word line in the usage reference cell and a bit line of both the selection unit cell and the usage reference cell to a wiring having the voltage Vg, and disconnecting other word lines and other bit lines in the cell array from a wiring having the voltage Vg at the time of write.

The non-volatile magnetic memory according to the first and second inventions may include a terminal circuit for disconnecting all word lines and all bit lines in the cell array from a wiring having the voltage Vg at the time of read.

The non-volatile magnetic memory according to the first invention may further comprise a first write circuit; a second write circuit; an X selector circuit for connecting a first word line and a second word line in a write unit cell to the first write circuit, and opening word lines in the cell array other than the first word line and the second word line in the write unit cell at the time of write; and a Y selector circuit for connecting a bit line in the write unit cell to the second write circuit, and opening bit lines in the cell array other than the bit line in the write unit cell at the time of write.

The non-volatile magnetic memory according to the second invention may further comprise a first write circuit; a second write circuit; an X selector circuit for connecting a word line in a write unit cell to the first write circuit, and opening word lines in the cell array other than the word line in the write unit cell at the time of write; and a Y selector circuit for connecting a bit line in the write unit cell to the second write circuit, and opening bit lines in the cell array other than the bit line in the write unit cell at the time of write.

The non-volatile magnetic memory according to the first and second inventions may include a connecting part for connecting a wiring having the voltage Vg to the bit lines in the cell array other than the bit line in the read unit cell at the time of read.

In the non-volatile magnetic memory according to the first and second inventions, the information read part may include an integrating part for integrating electric current, which flows into the bit line in the read unit cell; a current-voltage converting part for converting an output signal of the integrating part to voltage; and a comparison part for comparing an output voltage of the current-voltage converting part with the voltage Vg.

In the non-volatile magnetic memory according to the first and second inventions the cell array and other component may be superimposed.

BRIEF DESCRIPTION OF THE DRAWINGS

FIG. 1 is a view for explaining a structure of a TMR element and the principle of read thereof;

FIG. 2 is a view showing the principle of write to the TMR element;

FIG. 7 is a view showing an example of algorism in a self-reference system;

FIG. 21A and FIG. 21B are graphs showing a comparison between read current Is in the read method according to the present invention;

DETAILED DESCRIPTION OF THE PREFERRED EMBODIMENTS

The preferred embodiments of the present invention will be described specifically with reference to the attached drawings.

Figure 9:
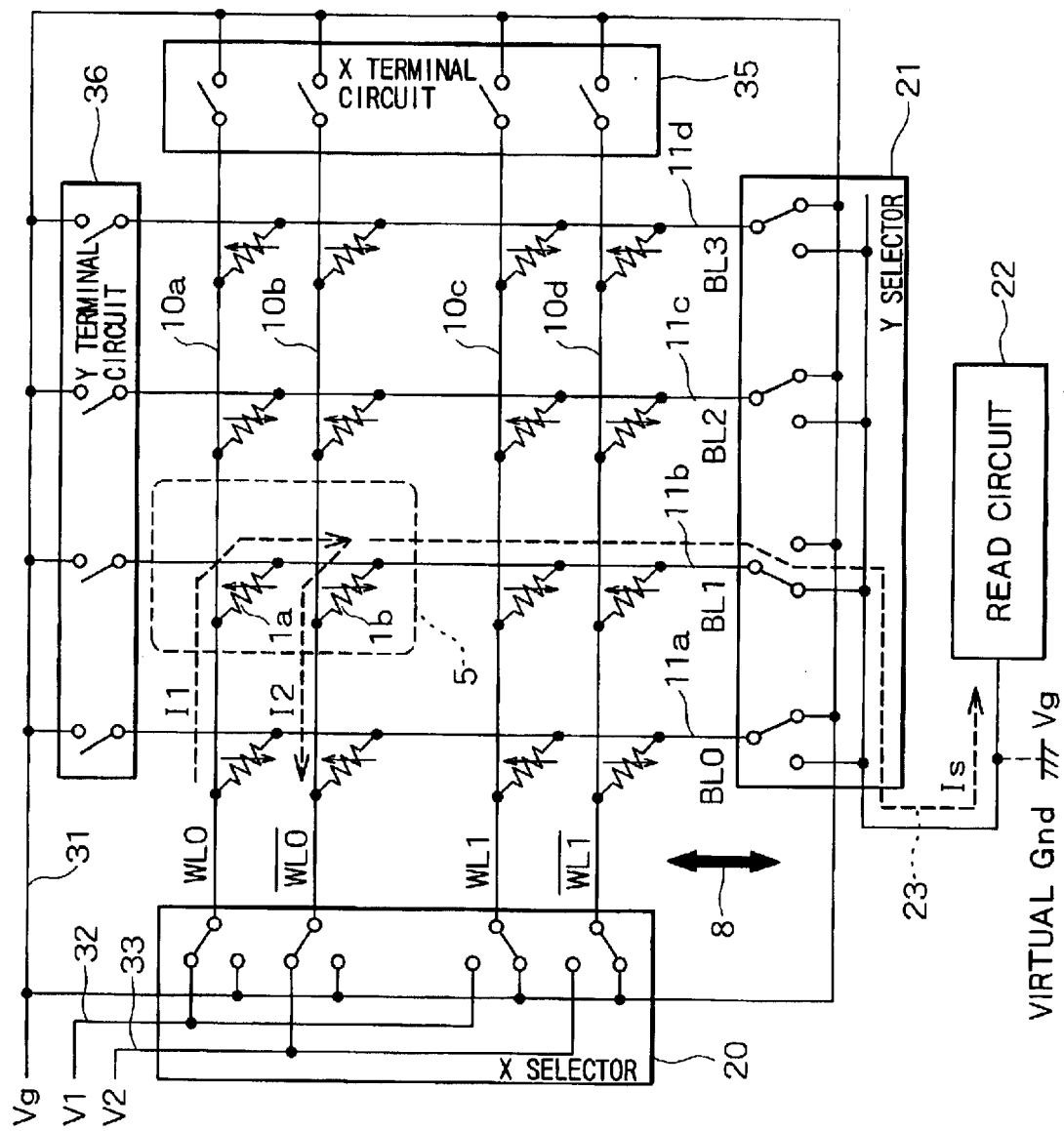
FIG. 9 is a diagram showing a read method in the non-volatile memory of a first embodiment according to the present invention.
Figure 10:
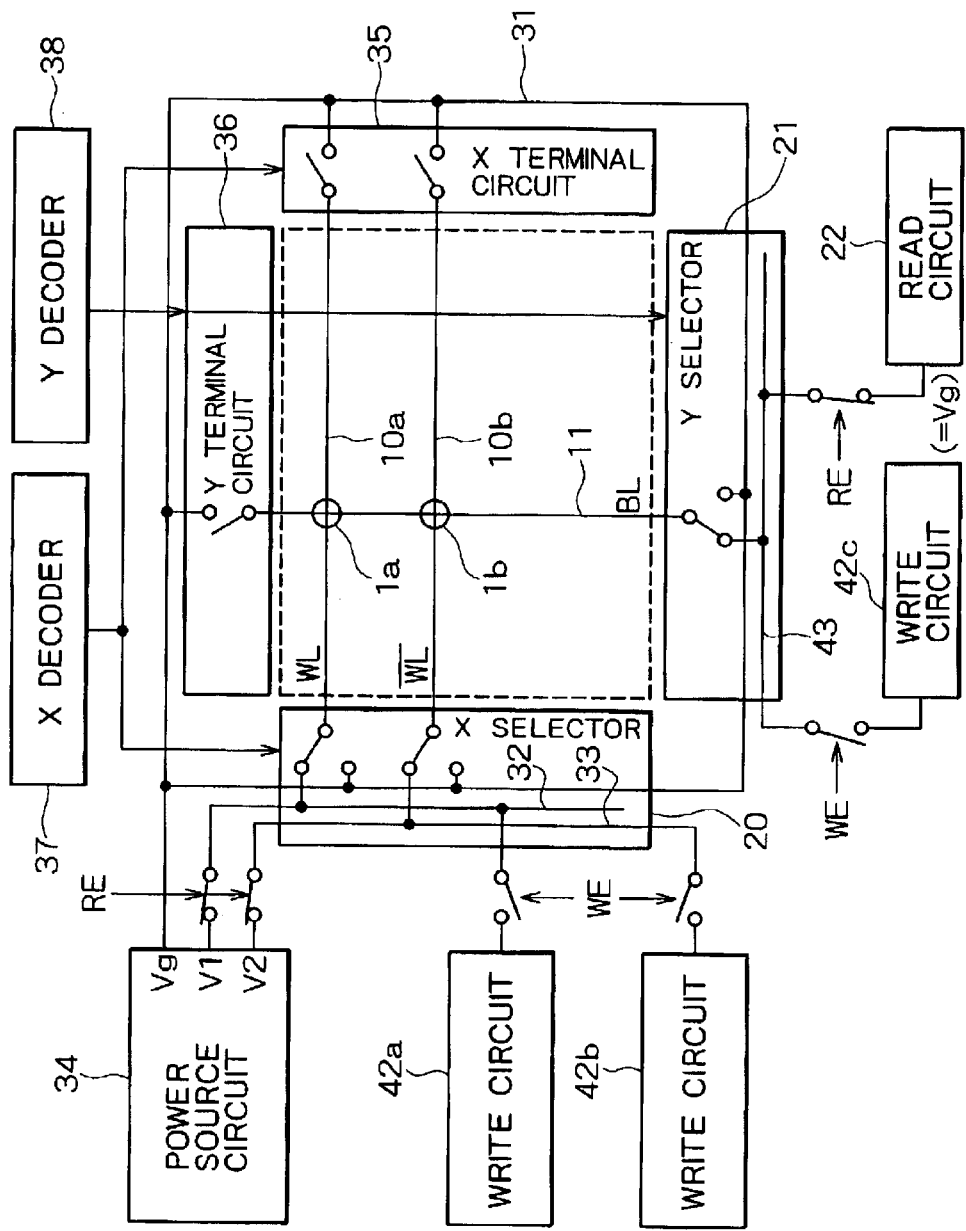
FIG. 10 is a diagram showing a first embodiment according to the present invention.

FIG. 9 is a diagram showing a read method of an MRAM according to the first embodiment of the present invention, and FIG. 10 is a diagram of a basic configuration of MRAM containing a peripheral circuit of a decoder and the like in this example.

As shown in FIG. 9, adjacent two TMRs 1a and 1b connected to word lines 10a and 10b on the same bit line 11b, respectively are defined as a unit cell 5. A cell array is formed such that a plurality of the unit cells 5 are arranged in a matrix. The respective TMRs are arranged so that the easy axes 8 of magnetization thereof are parallel to the bit line 11. The magnetization in free layers of the two TMRs 1a and 1b in the unit cell 5 performs memory operation (write operation) so that the directions of magnetization of the TMRs 1a and 1b always become different from each other. That is information is complementarily stored in these two TMRs 1a and 1b. This complementary write is carried out by passing current through the bit line 11b in an arbitrary direction and by simultaneously passing current through the word lines 10a and 10b in different directions. The current flowing in the word lines 10a and 10b produces a magnetic field whose directions are parallel to the easy axis of magnetization and is opposite to each other in TMRs 1a and 1b. The respective free layers are magnetized in different directions.

Next, the read principle in the first embodiment will be explained. As described above, since the complementary information is stored in TMRs 1a and 1b of the aimed cell, the resistance values of the respective TMRs are different from each other. These resistance values are read by applying the same voltage across the two TMRs and measuring the difference of current flowing in the respective TMRs. In this example, the different voltages V1 and V2 are applied to the word lines 10a and 10b and at the same time, voltage Vg expressed by the expression (1):

$$Vg=(V1+V2)/2 \quad \text{(expression 1)}$$

is applied to the bit line 11b. Then since V1, V2 and Vg have a relationship show in FIG. 11, the voltages applied across TMRs 1a and 1b become equal to each other. Here, assuming that the resistance values of TMRs 1a and 1b are defined as Ra and Rb respectively, currents I1 and I2 passed through the respective TMRs are as follows:

$$I1=(V1-Vg)/Ra=Vs/Ra \quad \text{(expression 2a)}$$

$$I2=(Vg-V2)/Rb=Vs/Rb \quad \text{(expression 2b)}$$

Thus, current Is, which is passed through the bit line 11b is expressed by the following expression.

$$Is=I1-I2=Vs \cdot (Rb-Ra)/(Ra \cdot Rb) \quad \text{(expression 3)}$$

If the input signal is defined as "1" at the time of Ra>Rb, and the input signal is defined as "0" at the time of Ra<Rb, the input signal is "0" in plus of the sign of Is and the input signal is "1" in minus of the sign of Is. Thus by detecting the sign of Is the memory information can be read easily.

Next, a cell selection method at the read will be described using a case where a unit cell 5 in FIG. 9 is selected. First, before selecting the cell a state where all word lines 10 and all bit lines 11 are connected to a power source line 31 of Vg and voltage is not applied to all TMR elements 1 is produced (precharge operation). Then, a word line 10a is connected to a power source line 32 of V1 and a word line 10b is connected to a power source line 33 of V2 so that the X selector and Y selector are switched so as to connect a bit line 11b to a read circuit 22. At this time the all switches of an X terminal circuit 35 and a Y terminal circuit 36 have been turned off. Since the input of the read circuit 22 is a low impedance terminal virtually grounded to Vg, voltage is applied to only TMRs 1a and 1b in the unit cell 5 and no voltage is applied to all TMRs other than those on the bit line 11b. By the above-mentioned operation the unit cell 5 is selected. Then electric current Is expressed by the expression 3 is passed through the bit line 11b to input to the read circuit 22. In the previous definition, when the direction of current Is is a direction flowing from the read circuit 22 to the bit line 11b, the input signal is "1" and when the direction of current Is is a direction flowing to the read circuit 22, the input signal is "0".

FIG. 10 is a basic structure of an MRAM containing peripheral circuits in the present embodiment. This basic structure comprises, in addition to the above-mentioned cell array, selector and terminal circuits, a read circuit 22 for detecting current direction passing through a selective bit line 11, a write circuit 42 for passing current through a selective word line 10 and a selective bit line in bi-direction, a power source circuit 34 for producing the above-mentioned three power source voltages, an X decoder 37 and Y decoder 38 for respectively applying an address signal to the X selector and the Y selector. A wiring 43 to the power source lines 32, 33 and the read circuit 22 is a wiring, which is used at the time of write and at the time of read in common, and the wiring is controlled by WE (write enable signal) and RE (read enable signal). At the time of write the power source lines 32, 33 are disconnected from the power source circuit 34 and is selectively connected to write circuits 42a, 42b. The wiring 43 is disconnected from the read circuit 22 and is connected to a write circuit 42c. Accordingly, write current can be passed to the selective word line 10 and the selective bit line 11 through X selector and Y selector. At the time of read the power source lines 32, 33 are respectively disconnected from the write circuits 42a, 42b and are connected to the power source circuit 34. Further, the wiring 43 is disconnected from the write circuit 42c and is connected to the read circuit 22. Thus, the read operation of the selective cell can be performed.

Figure 11:
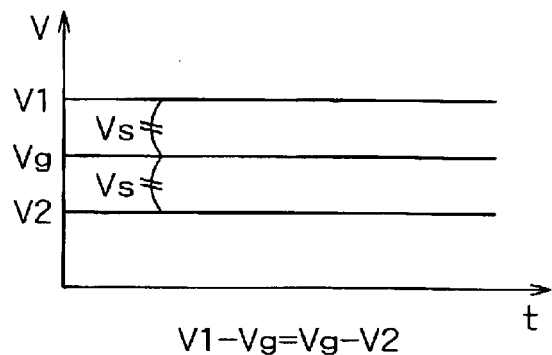
FIG. 11 is a diagram showing a relationship between V1, V2 and Vg.
Figure 12:
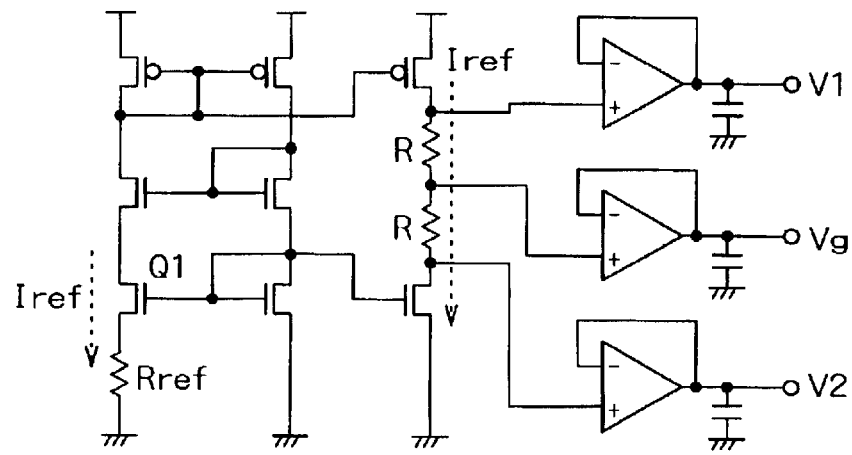
FIG. 12 is a diagram showing an example of a power source circuit, which produces V1, V2 and Vg.
Figure 13:
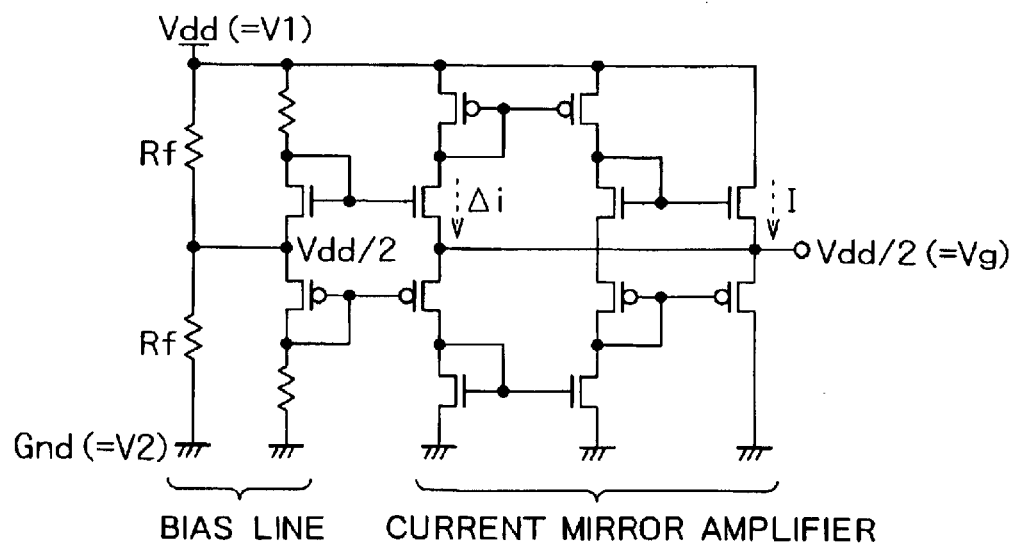
FIG. 13 is a diagram showing an example of a power source circuit, which produces Vdd/2.

FIGS. 12 and 13 are diagrams showing an example of a configuration of a power source circuit 34, which produces voltages V1, V2 and Vg having the relationship of the expression 1. As shown in FIG. 11, when the difference between V1 and Vg is defined as Vs, the difference between Vg and V2 reaches Vs. Vs is usually set to such a voltage (0.3 V–0.5 V) that the difference of currents passing through TMR at the time of storing "1" and passing through TMR at the time of storing "0" in a range of voltage not more than the breakdown voltage. FIG. 12 shows an example of a circuit in a case where V1, V2 and Vg are the intermediate electric potential between the power source voltage Vdd and Gnd (=0 V). Current Iref determined by the source voltage of Q1 and the reference resistance Rref is passed through two resistances R. The two resistances R have the same resistance values and the same current is passed therethrough. Thus the voltage drops due to these resistances become equal to each other and V1, V2 and Vg are produced expressed by the expression 1. These voltages are respectively impedance-converted through a buffer (voltage follower circuit) and act as a power source circuit. FIG. 13 shows an example of a Vg producing circuit in a case where V1 is equal to Vdd and V2 is equal to Gnd. Vg is a voltage of Vdd/2. This circuit comprises a bias step and a current mirror amplifier. When the output voltage is decreased to less than Vdd/2, this circuit is driven in a current increasing direction, and on the other hand, when the output current exceeds Vdd/2, the circuit is driven in a current decreasing direction.

Figure 14:
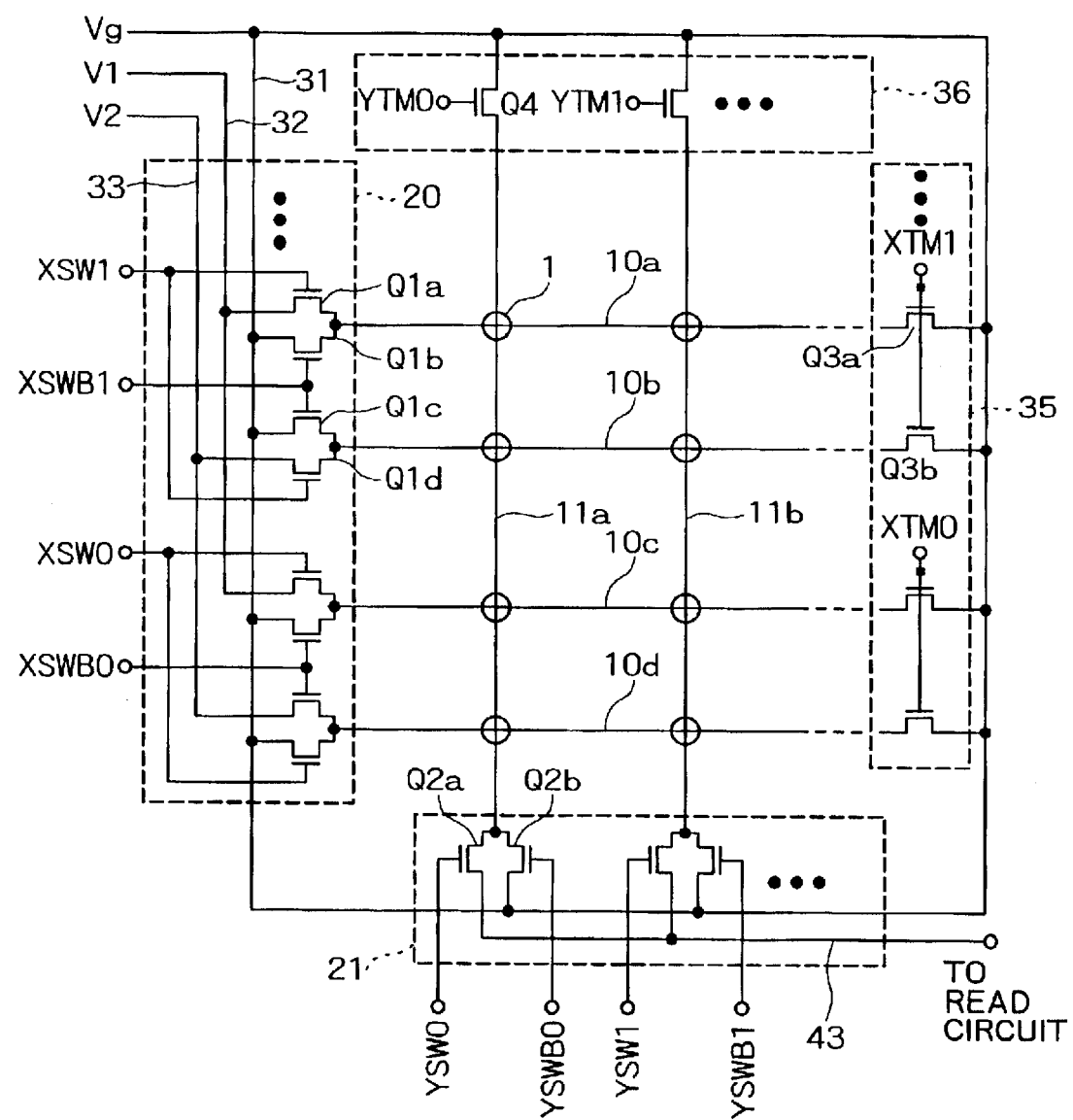
FIG. 14 is a diagram of a selector circuit and terminal circuit example 1 in the first embodiment.

FIG. 14 is an example of a configuration of a selector circuit and a terminal circuit in a case where V1, V2 and Vg are all intermediate voltages. In an X selector circuit 20, two NMOSs are connected to each word line. A transistor Q1a is a switch, which performs the connection between the word line 10a and the power source line 32 of V1 and a transistor Q1b is a switch, which performs the connection between the word line 10a and the power source line 31 of Vg. Further, a transistor Q1d is a switch, which performs the connection between the word line 10b and the power source line 33 of V2 and a transistor Q1c is a switch, which performs the connection between the word line 10b and the power source line 31 of Vg. In an Y selector circuit 21, two NMOSs are connected to each bit line. A transistor Q2a is a switch, which performs the connection between a bit line 11a and a wiring 43, which is the input terminal of a read circuit, and a transistor Q2b is a switch, which performs the connection between the bit line 11a and a power source line 31 of Vg. An X terminal circuit 35 comprises a switch group, which performs the connection between the respective word lines and the power source line 31 of Vg, and also Y terminal circuit 36 comprises a switch group, which performs the connection between the respective bit lines and the power source line 31 of Vg. Next, the operation of the respective selector circuits and the respective terminal circuits at the time of read operation will be described. At the time of read operation the all transistors in X terminal circuit 35 and Y terminal circuit 36 are turned off. When the word lines 10a, 10b and the bit line 11a are in a selection state, the transistors Q1a and Q1d in X selector 20 are turned on, and the transistors Q1b and Q1c in X selector 20 are turned off. Further, the transistor Q2a in Y selector 21 is turned on and the transistor Q2b is turned off. On the contrary, when the word lines 10a, 10b and the bit line 11a is in a non-selection state, the transistors Q1a and Q1d in X selector 20 are turned off, and the transistors Q1b and Q1c in X selector 20 are turned on. Further, the transistor Q2a in Y selector 21 is turned off and the transistor Q2b is turned on. On the other hand, at the time of write, the transistors Q1b, Q1c in X selector 20 and the transistor Q2b in Y selector 21 are always in an off state. When the word lines 10a, 10b are in a selection state, the transistors Q1a, Q1d in X selector 20 are turned on and the all transistors connected to other word lines are turned off. Further, the transistors Q3a and Q3b in X terminal circuit 35 are turned on and the other all transistors are turned off. Also when the bit line 11a is in a selection state, the transistor Q2a in Y selector 21 is turned on and all transistors connected to other bit lines are turned off. Further, a transistor Q4 in Y terminal circuit 36 is turned on and the other all transistors are turned off. It is noted that at the time (stand-by time) other than the times of the above-mentioned read and write, all transistors in X terminal circuit 35 and Y terminal circuit 36 and all transistors connected to the power source line 31 in X selector 20 and Y selector 21 are turned on so that the all word lines and all bit lines are in a state where a voltage of Vg was applied.

Figure 15:
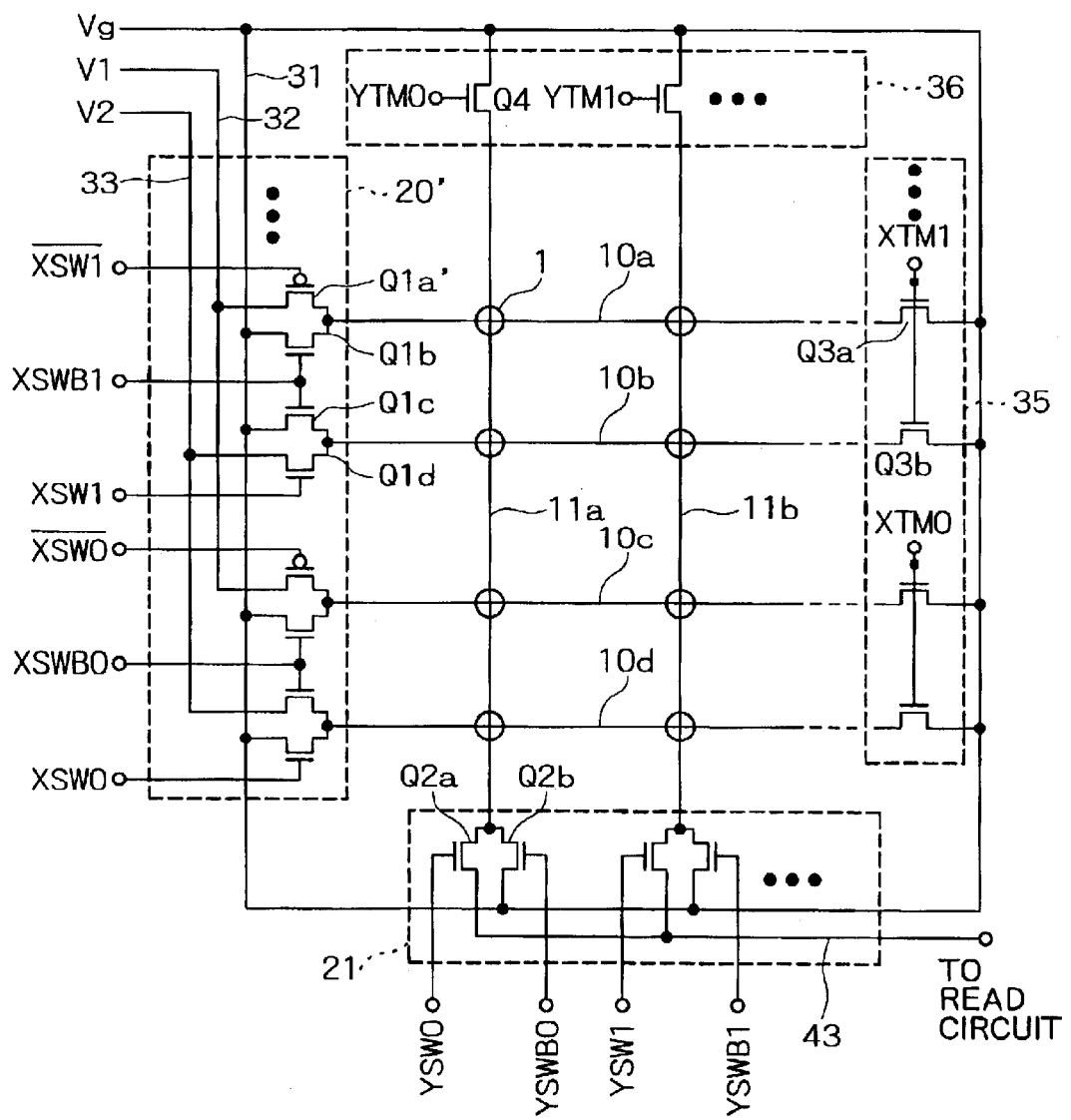
FIG. 15 is a diagram of a selector circuit and terminal circuit example 2 in the first embodiment.

In the X selector circuit 20 shown in FIG. 14, V1 is not used in a case where it is equal to the voltage of Vdd or it is a voltage near Vdd. The reason is that even if the transistor Q1a is turned on only a voltage of (Vdd−Vtn) is applied to the word line 10a. Here, Vtn is a threshold voltage in the NMOS. FIG. 15 shows an example of a configuration of a selector circuit and a terminal circuit at the time of V1=Vdd. Y selector 21 and the respective terminal circuits 35, 36 are the same as the configuration example shown in FIG. 14. In X selector 20' in FIG. 15, the NMOS transistor Q1a connected to V1 of X selector 20 in FIG. 14 was replaced with a PMOS transistor Q1a'. It should be noted that the operations at the time of write and at the time of read are the same as the explanation of the configuration example in FIG. 14.

Figure 16A:
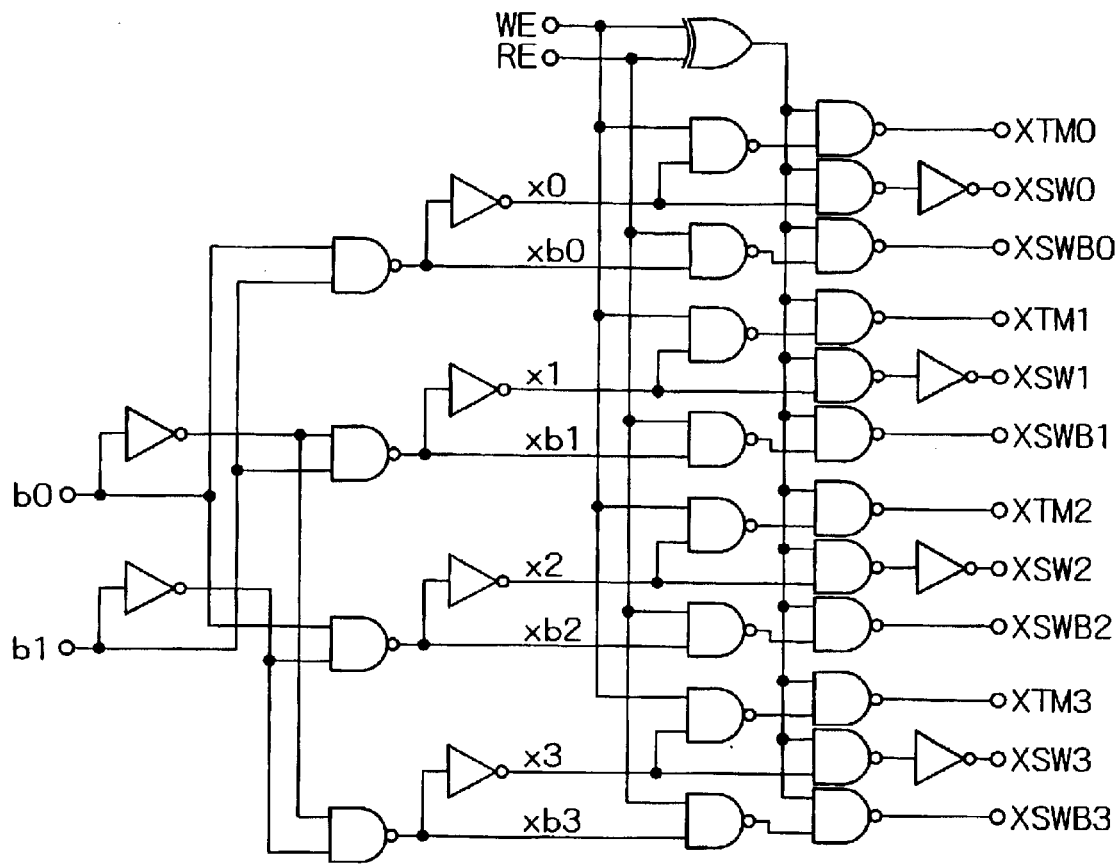
FIG. 16A is a circuit diagram of an X decoder 37 in the first embodiment (in the case of 2 bit of address signal) and FIG. 16B is a timing chart of the signal thereof.
Figure 16B:
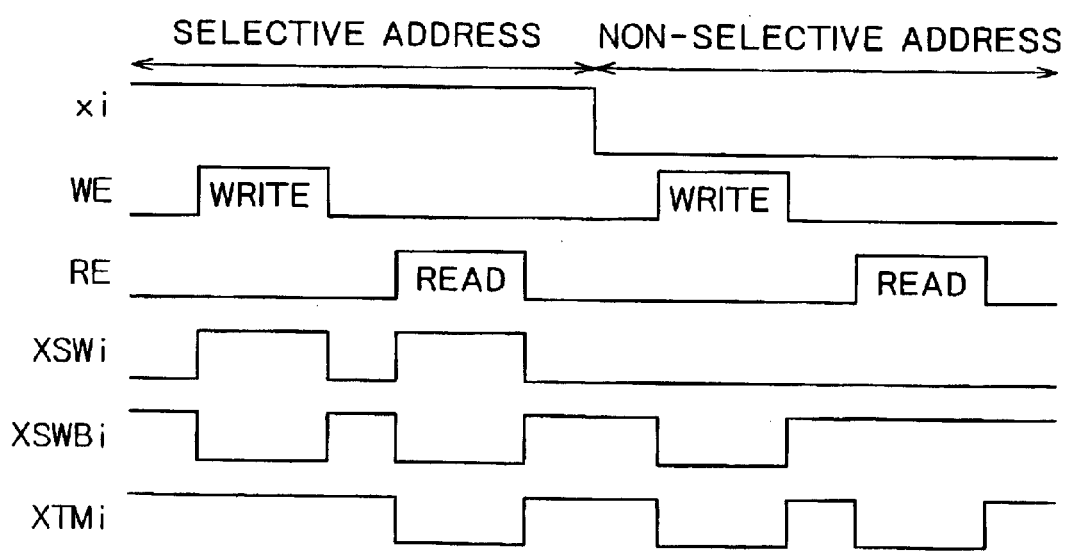

FIG. 16A is a circuit diagram of an X decoder 37, which selects a word line corresponding to the X address and controls the operations of said X selector 20 and X terminal circuit 35, and FIG. 16B is a timing chart of the signal thereof. This example shows a case where the address signal is 2 bits for convenience in the explanation. Further, Y decoder 38 can use the same circuit as in X decoder 37.

Figure 6:
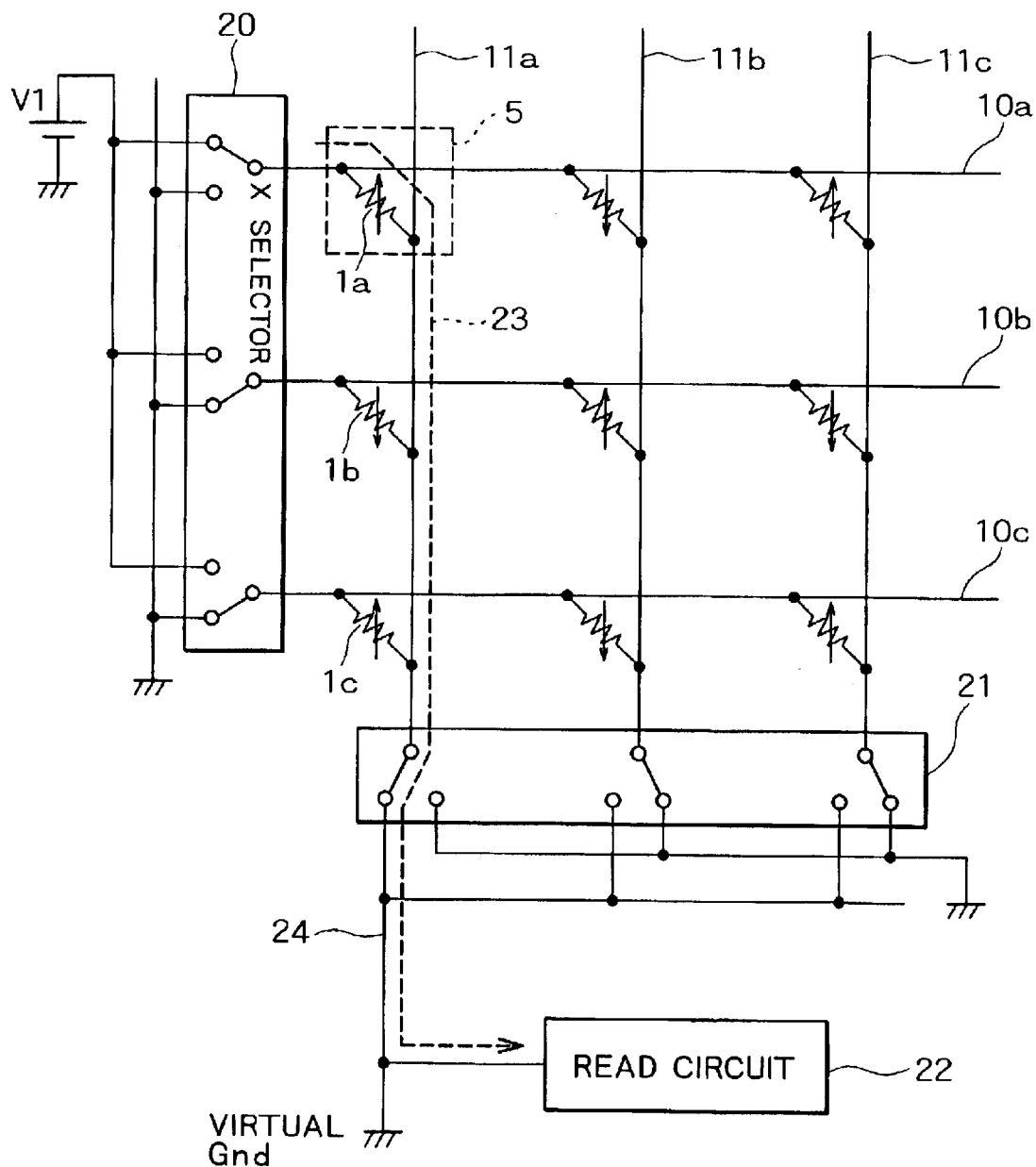
FIG. 6 is a diagram showing an MRAM (read by simple matrix array and self-reference system) of a prior art example 2.
Figure 8:
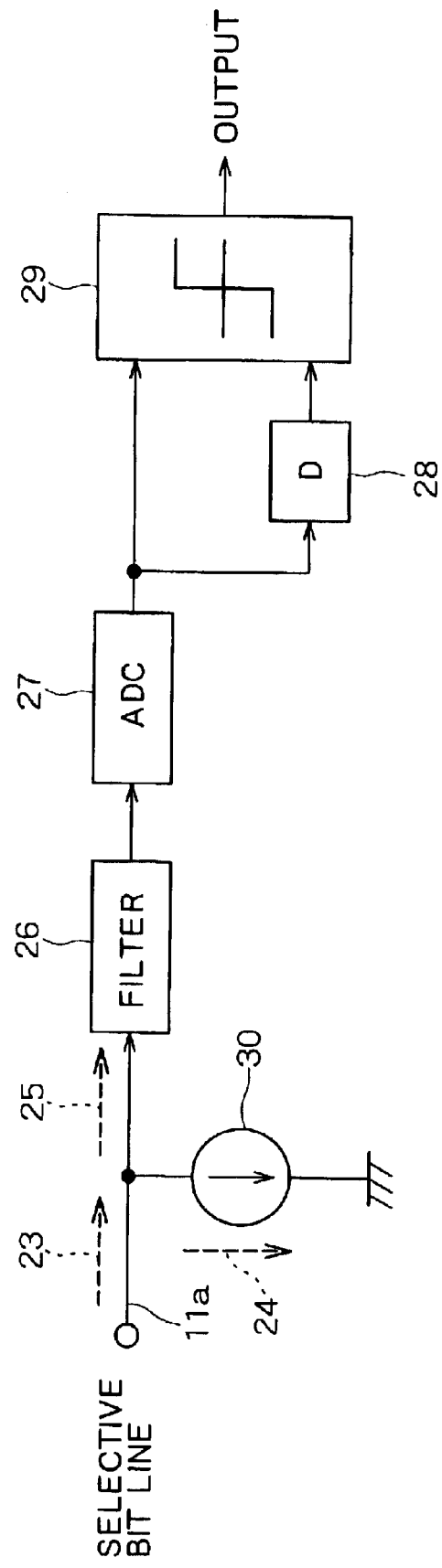
FIG. 8 is a circuit diagram showing an example of a basic configuration of a read circuit operated based on a self-reference system.
Figure 17A:
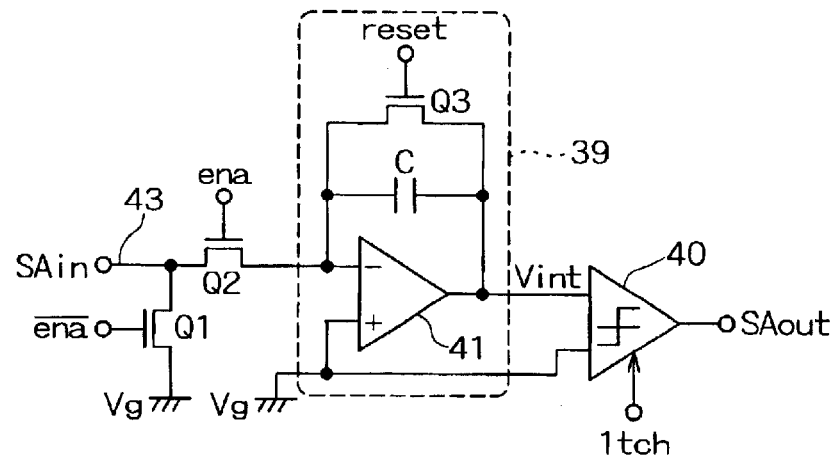
FIG. 17A is a circuit diagram of a read circuit 22 and FIG. 17B is a timing chart of signal showing the principle of operation.
Figure 17B:
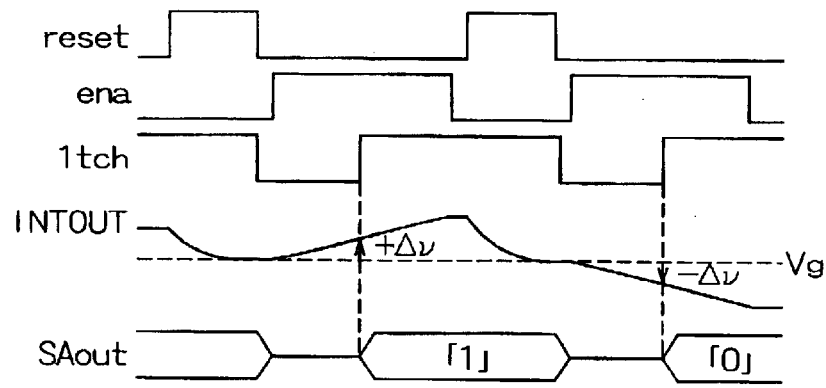

FIG. 17A is a circuit diagram of a read circuit 22 and FIG. 17B is a timing chart of signal showing the principle of operation. The read circuit in this example comprises an integrator 39 and a comparator 40. Here, the input terminal of the read circuit is the same as the wiring 43 in FIG. 10. The operation of the read circuit in this example will be described below. Q3 is turned on by a reset signal and Q2 is turned off and Q1 is turned on by ena (enable) signal, so that the integrator 39 is reset and the output voltage Vint of the integrator 39 is equalized to Vg. At this time the voltage of the input terminal is precharged to Vg. Then Q1 is turned off, Q2 is turned on and Q3 is turned off, so that the read current 23 from the cell array is charged to an integral capacitance C. Since the input terminal of the integrator 39 is a virtual ground terminal, the voltage of Vg is maintained. As shown in FIG. 17B, Vint is integrated upward and downward by the direction of the read current 23 and the signal "1" or "0" is determined by comparing the magnitude of Vint and Vg with comparator 40. As mentioned above, the integrator 39 has the function that the wiring 43 is set to a virtual ground (a voltage of Vg in this example) and the read current is converted to voltage while amplifying the current. Further, the integrator 39 has the function that noise in alternate current such as a sneak current from a non-selective cell. Since the offset component of the read current 23 is completely removed in a cell array in the read system according to the present invention, the offset current subtractor 30 shown in FIG. 8 is not needed in the read circuit. Since TMRs in the respective cells have variation in resistance values in a prior art example shown in FIG. 6, the current value of the offset current subtractor 30 must be controlled between cells or between arrays. However, in the read system according to the present invention the necessity of controlling the current value is not required. Further, in the read circuit shown in FIG. 8 the read current values must be correctly measured. Thus, an analog circuit of high precision (high linearity) and integral action time of about a few $\mu$secs are needed. Since twice read operations and twice write operations are needed in a self-reference system, the read time becomes long. However, in the read system according to the present invention the signal current 25 becomes twice and it is sufficient that only a direction of the flow of read current 23 is detected and the integral action time can be shortened to about a few tens nsecs—to a few hundreds nsecs. Further, in the read system of the present invention, the read is not carried out by the self-reference system and the read time becomes short so that the read can be performed without breaking the memory information. In this manner according to the present invention the read circuit 22 can be formed by a very simple circuit like a circuit diagram shown in FIG. 17A, whereby the circuit surface area for the read circuits can be decreased and power consumption can be also reduced.

Figure 18:
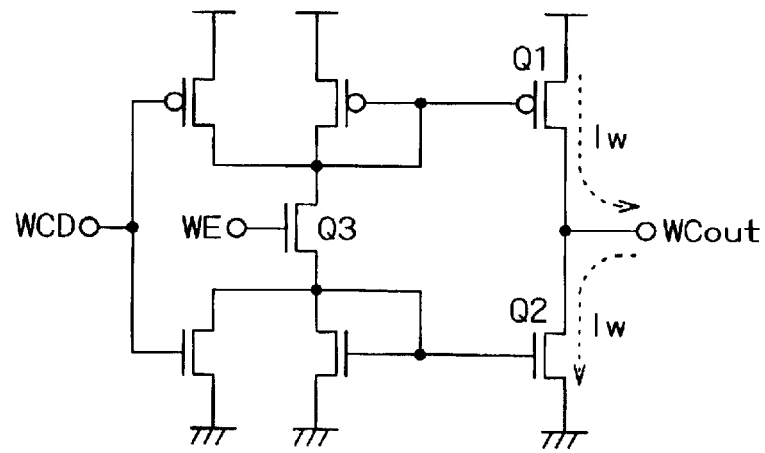
FIG. 18 is a diagram showing an example of a write circuit.

FIG. 18 is a circuit diagram of a write circuit 42. Since the write operation to a cell is performed by passing current through the word line and bit line in a direction according to information to be written, the write circuit 42 comprises a bi-directional current source. When WE (write enable signal) is made high, that is Q3 is turned on, the write circuit is in an operation state and a direction of the write current is determined by a WCD signal. When WCD is high, Q2 is turned off and an appropriate voltage is applied to the gate of Q1 so that write current can be passed in the right direction of FIG. 18. Also, when WCD is low, Q1 is turned off and an appropriate voltage is applied to the gate of Q2 so that write current can be passed in the left direction of FIG. 18.

Figure 19A:
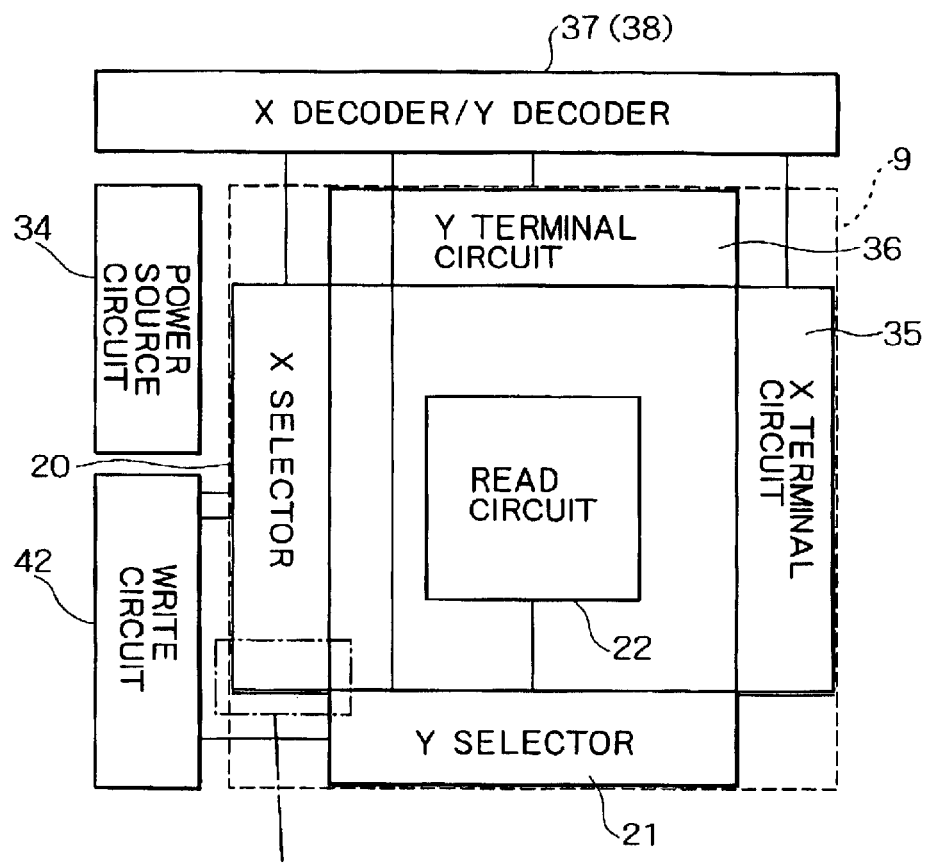
FIG. 19A is a block diagram showing an example of an MRAM chip layout in the first embodiment and FIG. 19B is a cross-sectional view of a part of the layout.
Figure 19B:
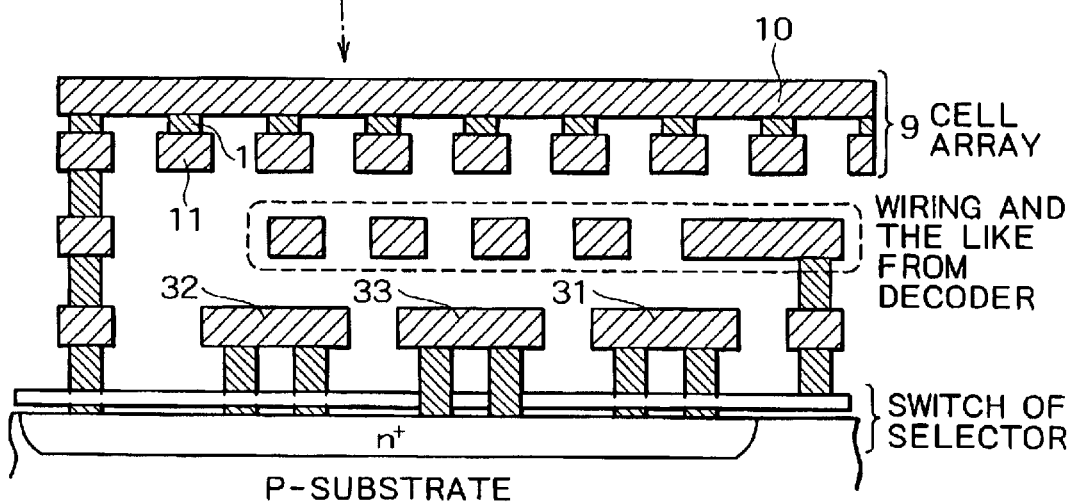

FIG. 19A is a block diagram showing an example of an MRAM chip layout in the present embodiment, and FIG. 19B is a cross-sectional view of a part of the layout. Since a cell array 9 does not include a transistor, a word line 10 or a bit line 11 can be realized with an aluminum wiring on the uppermost layer. Thus, if peripheral circuits such as selectors 20, 21 and terminal circuits 35, 36 and the like are arranged below the cell array 9, the possession of cells to the entire chips can be increased.

Figure 20:
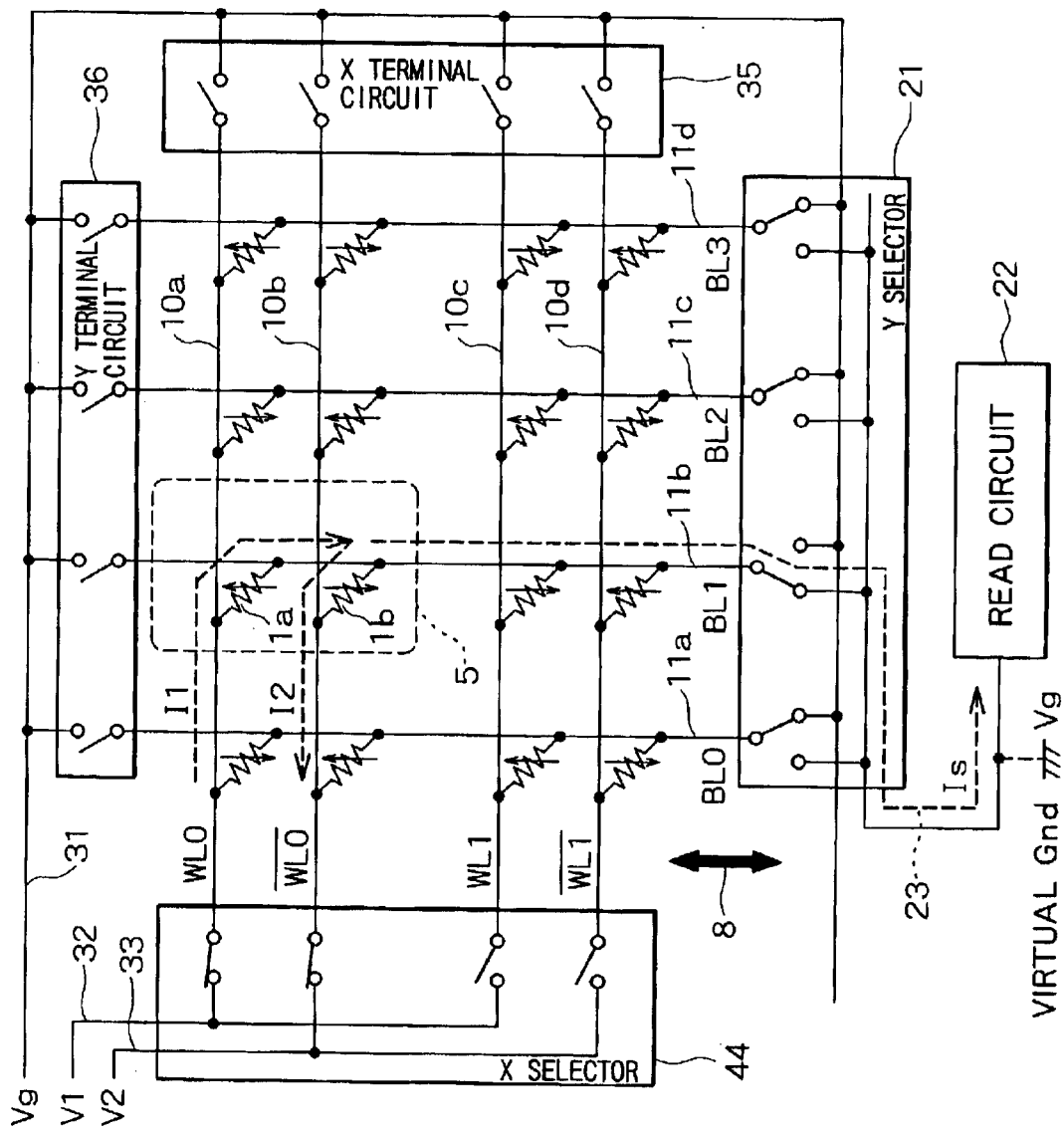
FIG. 20 is a diagram showing a read method of a second embodiment according to the present invention.

FIG. 20 is a block diagram showing a read method for MRAM according to a second embodiment of the present invention. It is noted that since the configuration of MRAM including peripheral circuits in the present invention is the same as in the first embodiment shown in FIG. 10, the description thereof will be omitted.

As shown in FIG. 20, the configuration of the cell array in the second embodiment is the same as in the above-described first embodiment, and two adjacent TMRs 1a, 1b, respectively connected to word lines 10a, 10b on the same bit line 11b are defined as a unit cell 5. In FIG. 20 a plurality of unit cells 5 are arranged in a matrix. Here, in the respective TMRs the directions of easy axes 8 of magnetization are arranged so to be in parallel to the bit line 11, respectively. The write of information is performed by passing current through the aimed bit line 11b in an arbitrary direction, passing current through the aimed word lines 10a, 10b in different directions from each other, and causing TMRs 1a, 1b to produce magnetic fields in opposite directions to the direction of easy axis of magnetization. Accordingly, the respective free layers of TMRs 1a, 1b are magnetized in opposite directions so that they complementarily store information. On the other hand, the read of information is performed by applying voltages of (V1−Vg) and (Vg−V2) respectively across these two TMRs 1a and 1b and detecting differences between currents produced by the difference between resistance values of TMRs 1a, 1b. Here, V1, V2 and Vg have the relationship expressed by expression 1. Then current Is expressed by expression 3 is passed through the aimed bit line 11b and memory information can be easily read by detecting the sign (direction).

Next, a method of cell selection at the time of read in the second embodiment will be described using a case where the unit cell 5 of FIG. 20 is selected as an example. First, before selecting a cell, all word lines 10 and bit lines 11 are connected to the power source line 31 of Vg and a state where a voltage of 0 V is applied across all TMRs 1 is produced. Then a word line 10a is connected to a power source line 32 of V1, a word line 10b is connected to a power source line 33 of V2 and all other word lines are released (raised the impedance). At the same time the bit line 11b is connected to a read circuit 22 and other bit lines are connected to the power source line 31 of Vg. At this time the switches of X terminal circuit 35 and Y terminal circuit 36 are all turned off. Since an input wiring 43 for the read circuit is a low impedance terminal virtually grounded to Vg, the above-mentioned voltages are applied to TMRs 1a, 1b in unit cell 5 and the read current Is is input to the read circuit 22. Here, the same voltages are applied to TMRs of cells other than the unit cell 5 connected to the word lines 10a, 10b and current can flow to the respective bit lines whereby a possibility of addition of current to the bit line 11b through an innumerable nonselective TMRs is generated. Nevertheless, by sufficiently decreasing the on resistances of the respective switches in Y selector 21 more than the resistance values of the respective TMRs 1 almost all of these currents can be passed through the power source line 31. Therefore, although the method of cell selection at the time of read in the present embodiment is different from the first embodiment, the read current Is input into the read circuit 22 shows the same value as in the first embodiment. FIGS. 21A, 21B show read current spice simulation results of the first and second embodiments respectively As shown in FIGS. 21A, 21B, the read current is the same value both in the first embodiment and the second embodiment.

Figure 22:
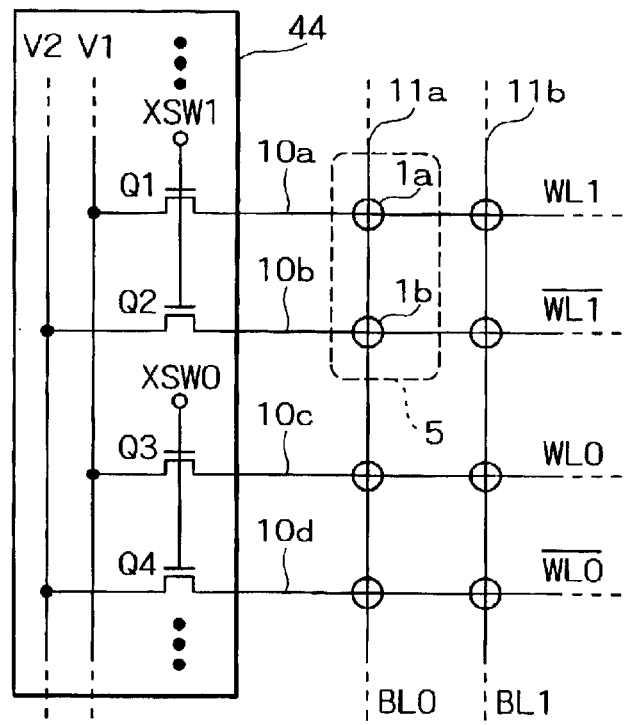
FIG. 22 is a diagram showing an X selector circuit example 1 in the second embodiment.
Figure 23:
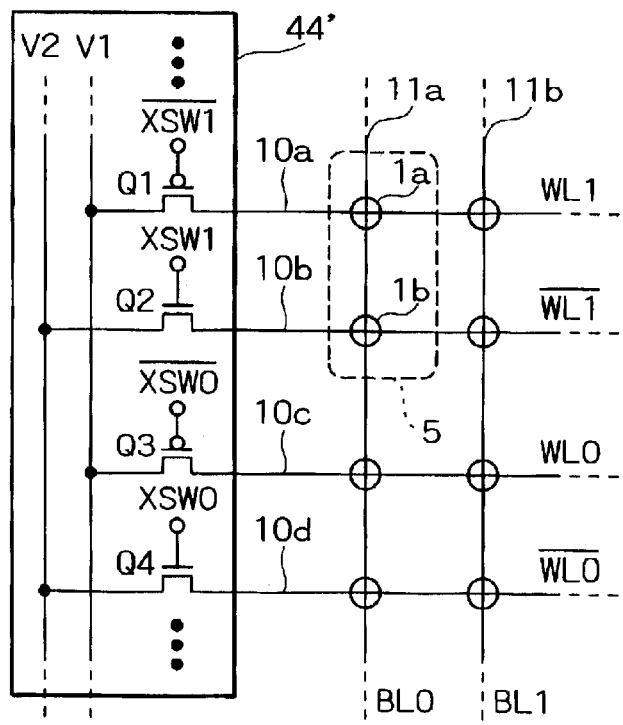
FIG. 23 is a diagram showing an X selector circuit example 2 in the second embodiment.

FIGS. 22 and 23 are diagrams showing configuration examples of X selectors 44 for realizing the above-mentioned read methods. With reference to Y selectors, X terminal circuit 35 and Y terminal circuit 36, the circuit shown in FIG. 14 and described in the first embodiment can be used. FIG. 22 is a circuit example of X selector 44 in a case where V1, V2 and Vg are intermediate potential. In FIG. 22, one NMOS is connected to each of the word lines 10. A transistor Q1 is a switch for the connection between the word line 10a and the power source line 32 of V1 and a transistor Q2 is a switch for the connection between the word line 10b and the power source line 33 of V2. When a write operation to a cell 5 is performed, an XSW1 terminal becomes high and transistors Q1, Q2 are turned on and other transistors Q3, Q4 are turned off, so that current is passed through the word lines 10a, 10b. At this time X terminal circuit 35 is operated so that only word lines 10a, 10b are terminated to Vg. Also, when a read operation for the cell 5 is performed, an XSW1 terminal becomes high and transistors Q1, Q2 are turned on and other transistors Q3, Q4 are turned off. Further, during standby of operations other than the write and read operations, all transistors in X selector 44 are turned off and all transistors in X terminal circuit 35 are turned on, so that all word lines 10 are precharged to Vg. Thus, in X selector 44 of the present second embodiment shown in FIG. 22, the circuit surface area can be set to a half of that of X selector 20 of the first embodiment shown in FIG. 14, and control of X selector 44 becomes easy. Further, the number of wiring from X decoder can be decreased to a half. FIG. 23 is an example of a circuit of X selector 44 in a case where V1 is equal to Vdd or Vi is a voltage around the voltage Vdd. In this case the NMOS transistors Q1 and Q3 connected to V1 in X selector 44 shown in FIG. 22 were replaced with PMOS transistors. Even in this circuit example the circuit surface area can be reduced to about a half of that of X selector 20 in the first embodiment shown in FIG. 14 and the number of wiring from X decoder can be decreased. However, since PMOS transistors are mounted on NWELL, the circuit of the PMOS transistors become larger than the circuit shown in FIG. 22.

Figure 24A:
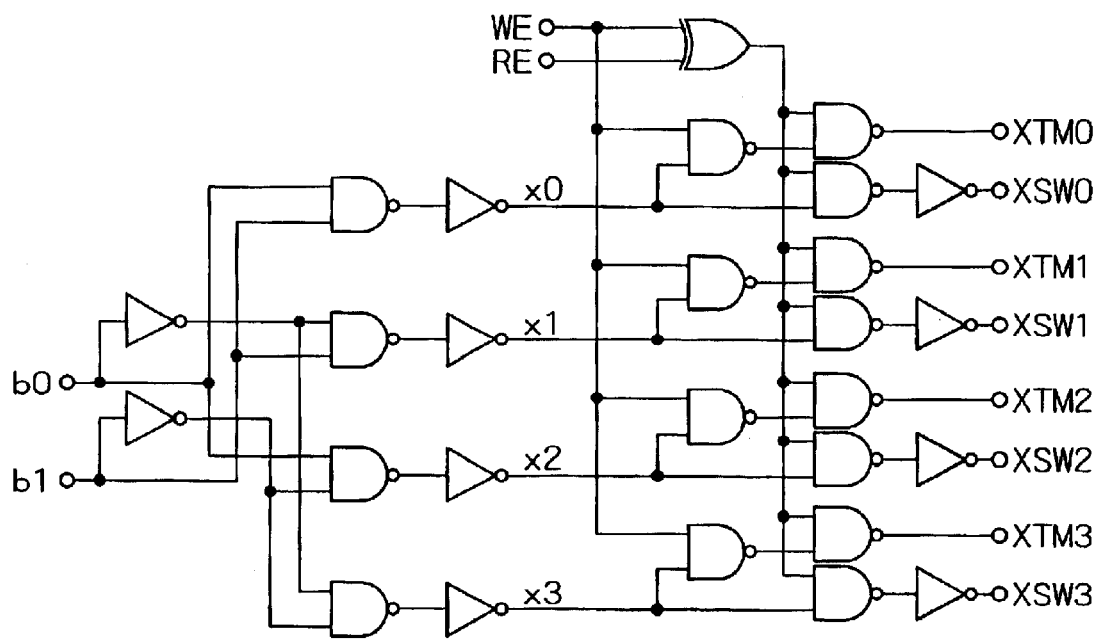
FIG. 24A is a circuit diagram of the X decoder 37 in the second embodiment (in the case of 2 bit of address signal) and FIG. 24B is a timing chart of its signals.
Figure 24B:
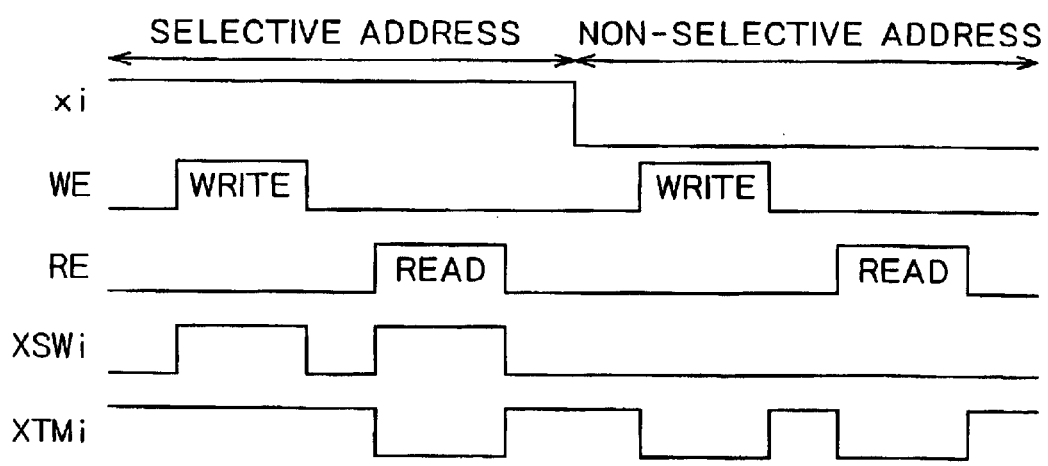

FIG. 24A is a circuit diagram of the X decoder 37 for selecting a word line corresponding to X address and controlling the above-mentioned X selector 44 and X terminal circuit 35, and FIG. 24B is a timing chart of its signals. The circuit surface area in X decoder 37 can be further decreased than that of X decoder of the first embodiment shown in FIGS. 16A and 16B.

In the above descriptions the read system and X selector 44, and X decoder 37 in the present invention were explained. In this example, Y selector 21, Y terminal circuit 36, Y decoder 38, power source circuit 34, write circuit 42 and read circuit 43 other than the X selector 44 and X decoder 37 can use the same circuit as in the first embodiment as they are. Further, in the present invention, as shown in FIGS. 19A and 19B, peripheral circuits such as a selector, a terminal circuit and the like, can be arranged below the cell array layer.

Figure 25:
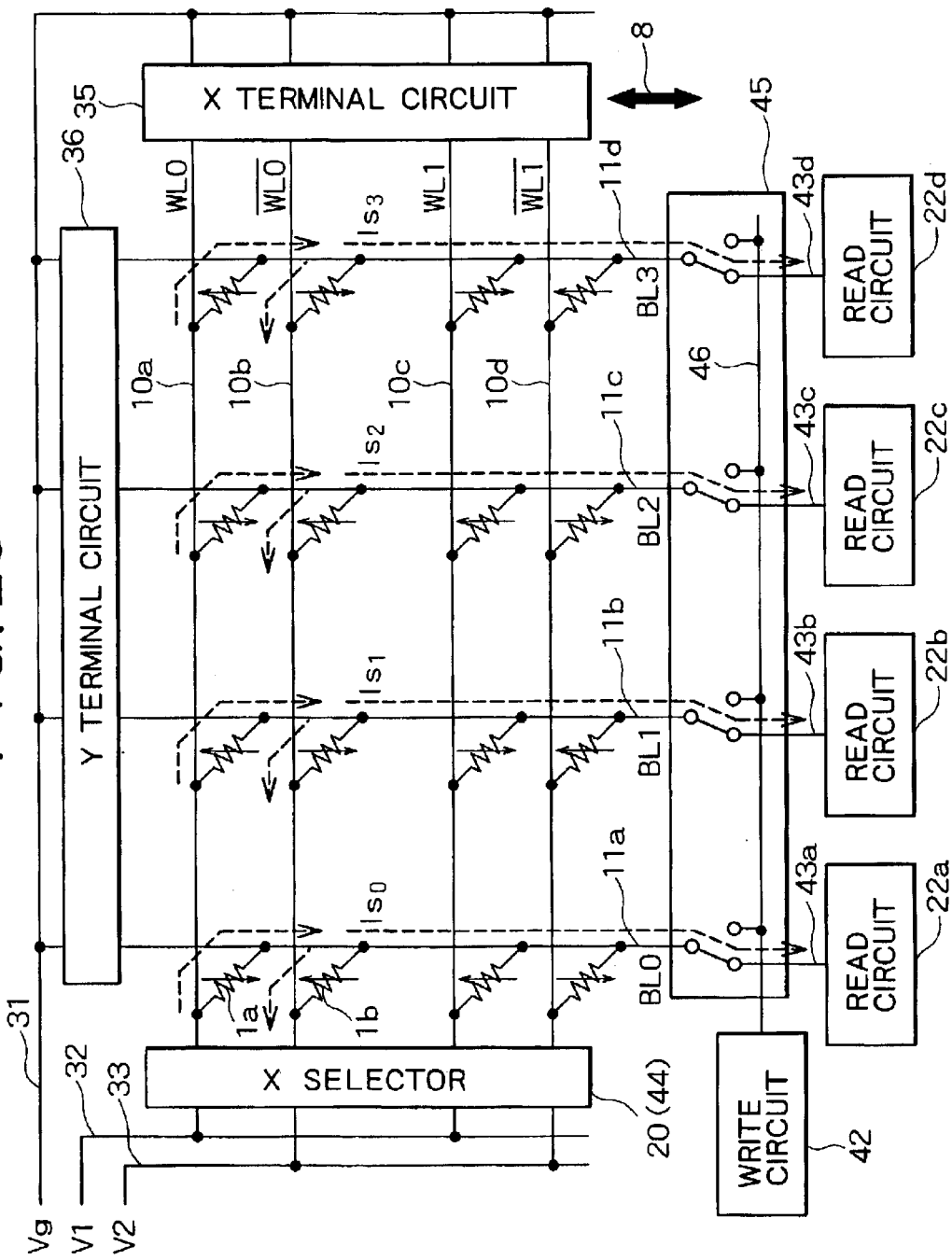
FIG. 25 is a diagram showing a third embodiment according to the present invention.

FIG. 25 is a circuit diagram showing a basic configuration of an MRAM according to a third embodiment of the present invention. It is noted that in FIG. 25, peripheral circuits such as a power source circuit 34, a write circuit 42 in a direction of the word line, decoders 37, 38 and the like are the same configuration as that shown in FIG. 10 and the descriptions of the configuration are omitted for the sake of convenience. The third embodiment has a feature that a plurality of read circuits 22 are arranged in one cell array 9 in parallel to each other in the above-mentioned first or second embodiment and a plurality of cells on the selective word line are read by one operation. It should be noted that FIG. 25 is an example in which a read circuit 22 is provided on all bit lines 11.

Figure 26:
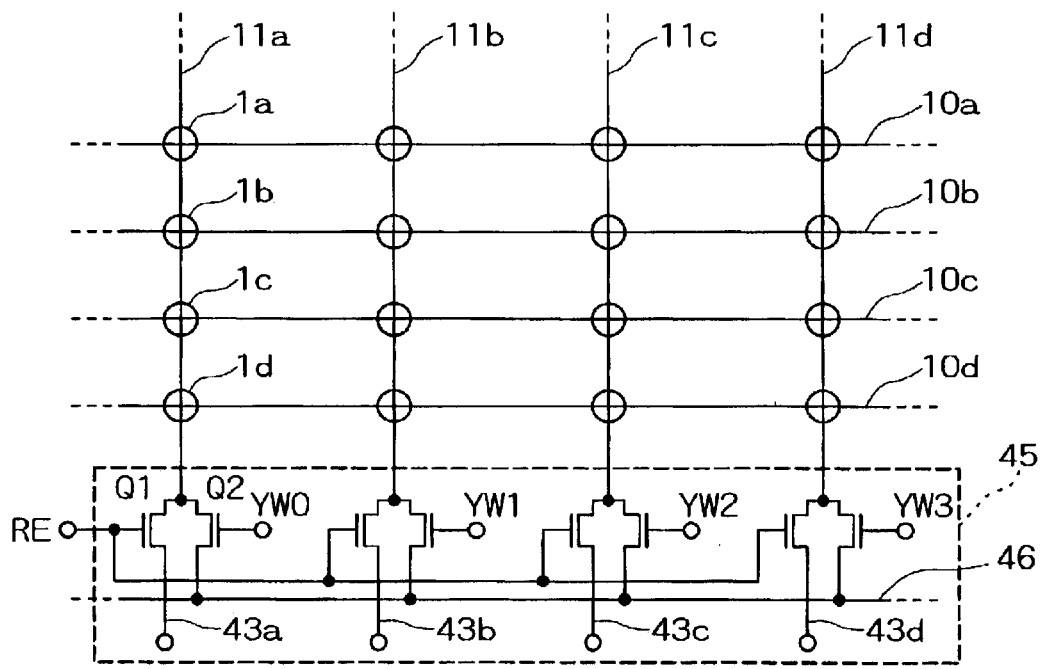
FIG. 26 is a diagram showing a Y selector circuit example in the third embodiment.

As in the above-mentioned first and second embodiments, the adjacent two TMRs on the same bit line is a unit cell and unit cells are arranged in a matrix to form a cell array. The storage and read of information are performed in such a manner that the directions of magnetization of the respective TMRs in the unit cell always become opposite to each other. The terminal circuits 35, 36 are the same as those shown in FIG. 14. Further, an X selector is the same as the circuit shown in FIGS. 14 and 15 or FIGS. 22 and 23. A Y selector 45 is such a circuit as shown in FIG. 26, and a switch at the time of read is different from a switch at the time of write.

An operation at the time of read will be explained using a case where the cell on the word lines 10$a$, 10$b$ was selected as an example. Voltages of V1, V2 and Vg have a relationship shown in expression 3. The word line 10$a$ is connected to a power source line 32 of V1 and the word line 10$b$ is connected to a power source line 33 of V2 in X selector. Word lines 10$c$ and 10$d$ other than the word lines are connected to a power source line 31 of Vg or released. Then the all transistors in X terminal circuit 35 and Y terminal circuit 36 are in an off mode. At the same time when the above-mentioned operation is performed, the respective bit lines 11$a$ to 11$d$ are connected to read circuits 22$a$ to 22$d$ respectively in the Y selector. This makes RE (read enable signal) in Y selector circuit 45 shown in FIG. 26 high and makes YW0 to YW3 low. Wiring 43$a$ to 43$d$ is all virtually grounded and a voltage of (V1−Vg) is applied across TMR on the word line 10$a$ and a voltage of (Vg−V2) is applied across TMR on the word line 10$b$. Then signal currents Is0 to Is3 are passed through the respective bit lines 11$a$ to 11$d$, respectively and input to the respective read circuits 22$a$ to 22$d$ as shown in FIG. 25. Therefore, one read operation can read all cells on the selective word lines.

Next, a write operation will be explained using a case where information is written to a cell composed of TMRs 1$a$ and 1$b$ as an example. First, by X terminal circuit 35 and Y terminal circuit 36 all word lines 10 and bit lines 11 are connected to the power source line of Vg. Then by X selector 20 only the word lines 10$a$ and 10$b$ are respectively connected to the write circuit 42 so that current is passed through the respective word lines in different directions. At the same time where the above-mentioned operation is performed, YW0 of Y selector 45 is made high and only the transistor Q2 is turned on and the bit line 11$a$ is connected to a write circuit 42 to pass current therethrough. Complementary write can be carried out by a magnetic field, which the current produces on TMRs 1$a$, 1$b$. It is noted that since the easy axes of magnetization of the respective TMRs are arranged in parallel to the bit line in this example, the direction of current flowing in the bit line 11$a$ may be arbitrary.

Further, in the present invention, as shown in FIG. 19, peripheral circuits such as a selector, a terminal circuit and the like, can be arranged below the cell array layer.

Figure 27:
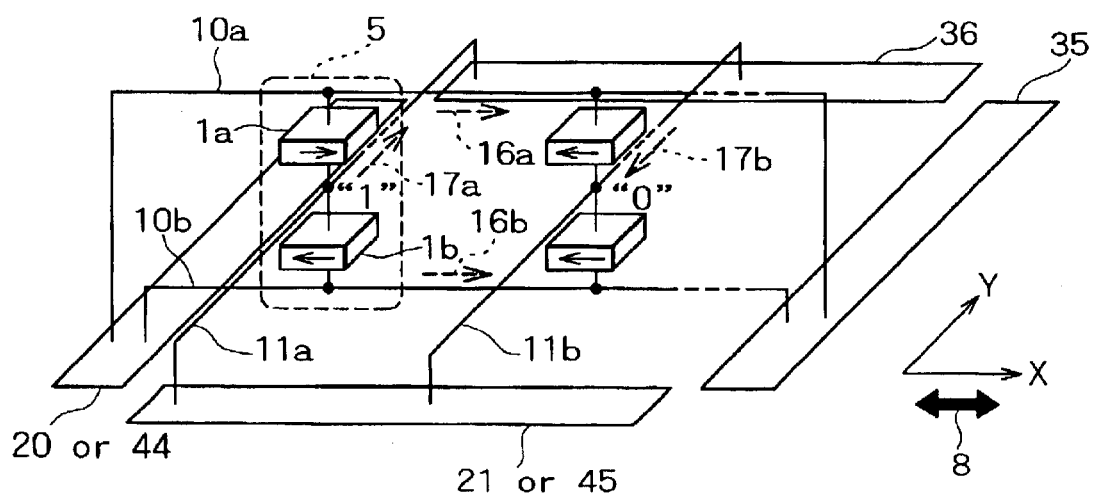
FIG. 27 is a schematic view showing a fourth embodiment according to the present invention.

FIG. 27 is a schematic diagram showing a fourth embodiment. The present invention has a TMR vertically laminated cell array in the above-mentioned first to third embodiments.

As shown in FIG. 27, there are a word line 10$b$ on a first plane, a bit line 11$a$ on a second plane orthogonal to the word line 10$b$, and a word line 10$a$ on a third plane orthogonal to the bit line 11$a$, and there are TMR 1$b$ connected to the word line 10$b$ and the bit line 11$a$ on a fourth plane and TMR 1$a$ connected to the word line 10$a$ and the bit line 11$a$ on a fifth plane. A unit cell 5 comprises the word lines 10$a$, 10$b$, the bit line 11$a$ and TMRs 1$a$, 1$b$, and a plurality of cells 5 are arranged in a matrix to form a cell array. To the respective word lines 10 are connected X selectors 20, 44 shown in FIGS. 14, 15 or FIGS. 22, 23 and is connected an X terminal circuit 35 shown in FIG. 14. Further, to the respective bit lines 11 are connected Y selectors 21, 45 shown in FIG. 14 or 26 and is connected a Y terminal circuit 36 shown in FIG. 14. The two TMRs 1$a$ and 1$b$ are vertically laminated so that complementary write to a cell can be easily performed. For example, as shown in FIG. 27, when easy axes of magnetization for the respective TMRs are parallel to the direction of X, information of "1" and "0" can be complementarily written in a direction of write current 17 on the bit line. At this time the directions of write currents 16$a$, 16$b$ on the word line may be arbitrary. The read of the cell 5 is carried out by the process explained in the first or second embodiment, a voltage of V1 is applied to the word line 10$a$ and a voltage of V2 is applied to the word line 10$b$ and other word lines are released or a voltage of Vg is applied to other word lines. Here, V1, V2 and Vg are voltages, which satisfy the relationship of expression 1. Further, the bit line 11$a$ is connected to an input terminal 43 for a read circuit 22 virtually grounded to Vg and a voltage of Vg is applied to other bit lines. By the above described operation a signal current Is expressed by expression 3 is input to the read circuit 22 and "1" or "0" is determined by detecting the direction of Is.

The configuration of MRAM in the present invention facilitates a complementary write operation as described above and the cell surface area of the unit cell 5 is made ½ whereby the cell possession can be enhanced.

Figure 28:
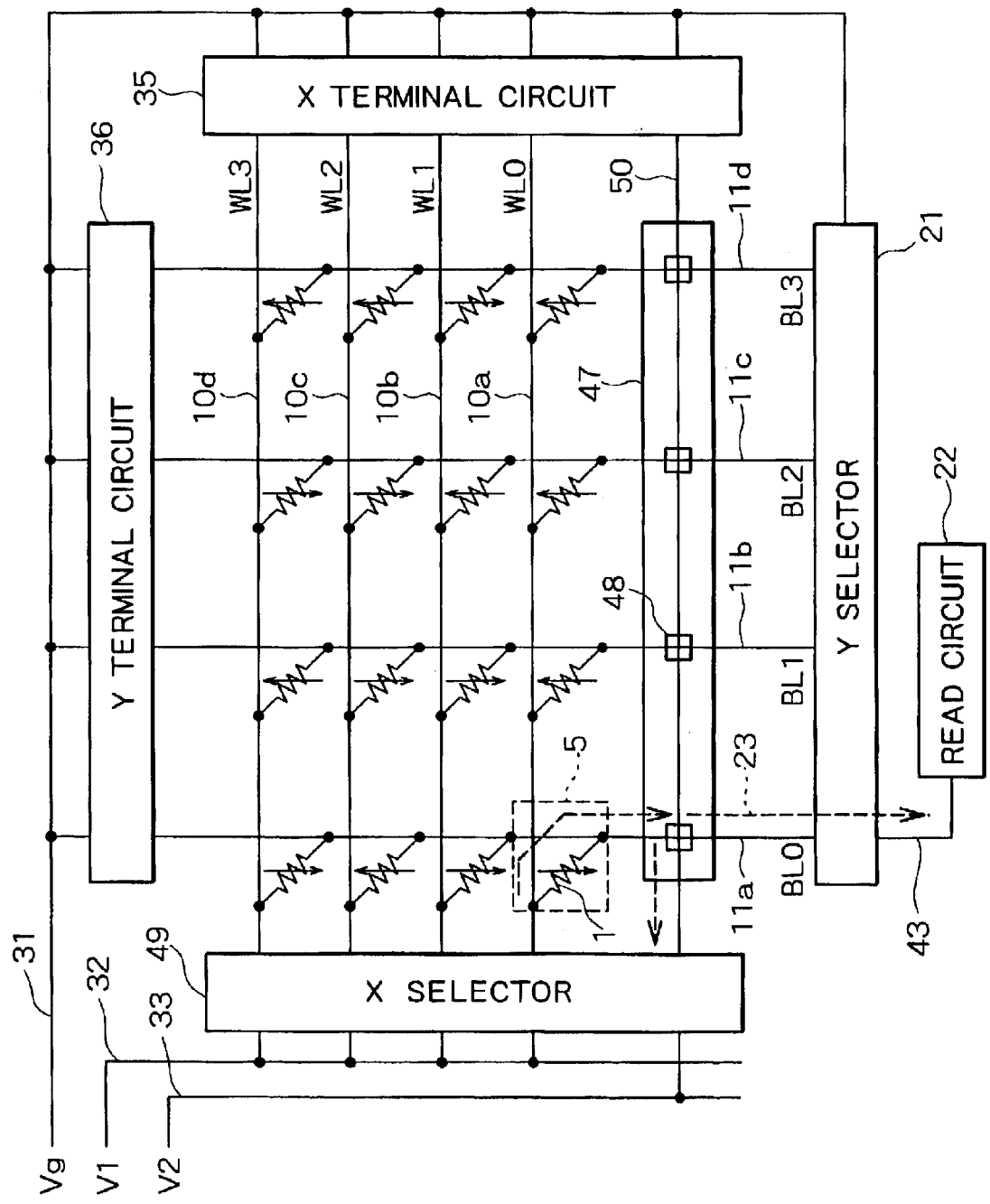
FIG. 28 is a diagram showing a fifth embodiment according to the present invention.

FIG. 28 is a circuit diagram showing a non-volatile memory according to a fifth embodiment of the present invention. Further, peripheral circuits such as a decoder, a write circuit and the like are omitted for the sake of convenience in explanation.

Figure 3A:
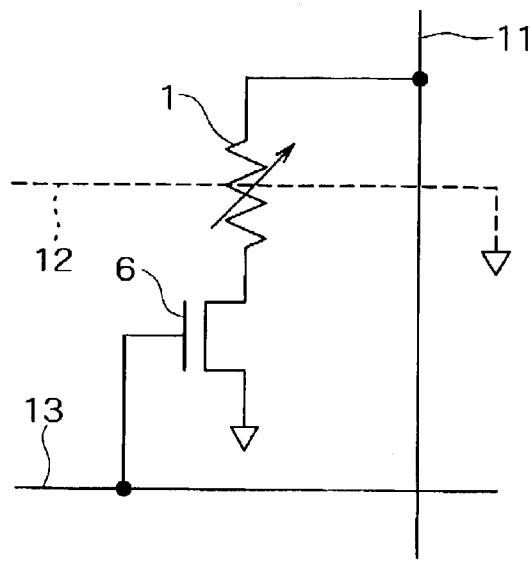
FIGS. 3A and 3B are views showing a structure of a memory cell of a prior art example 1.
Figure 3B:
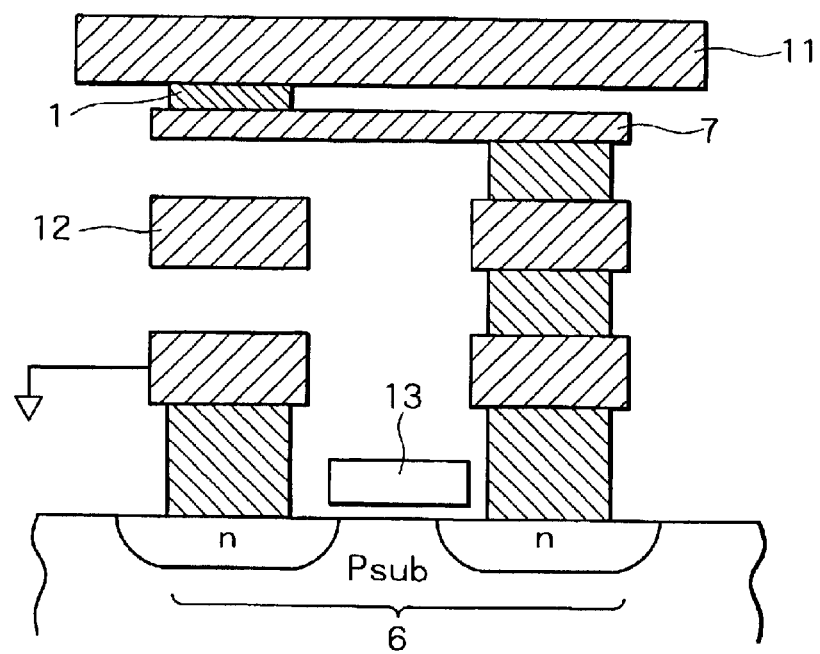
Figure 4:
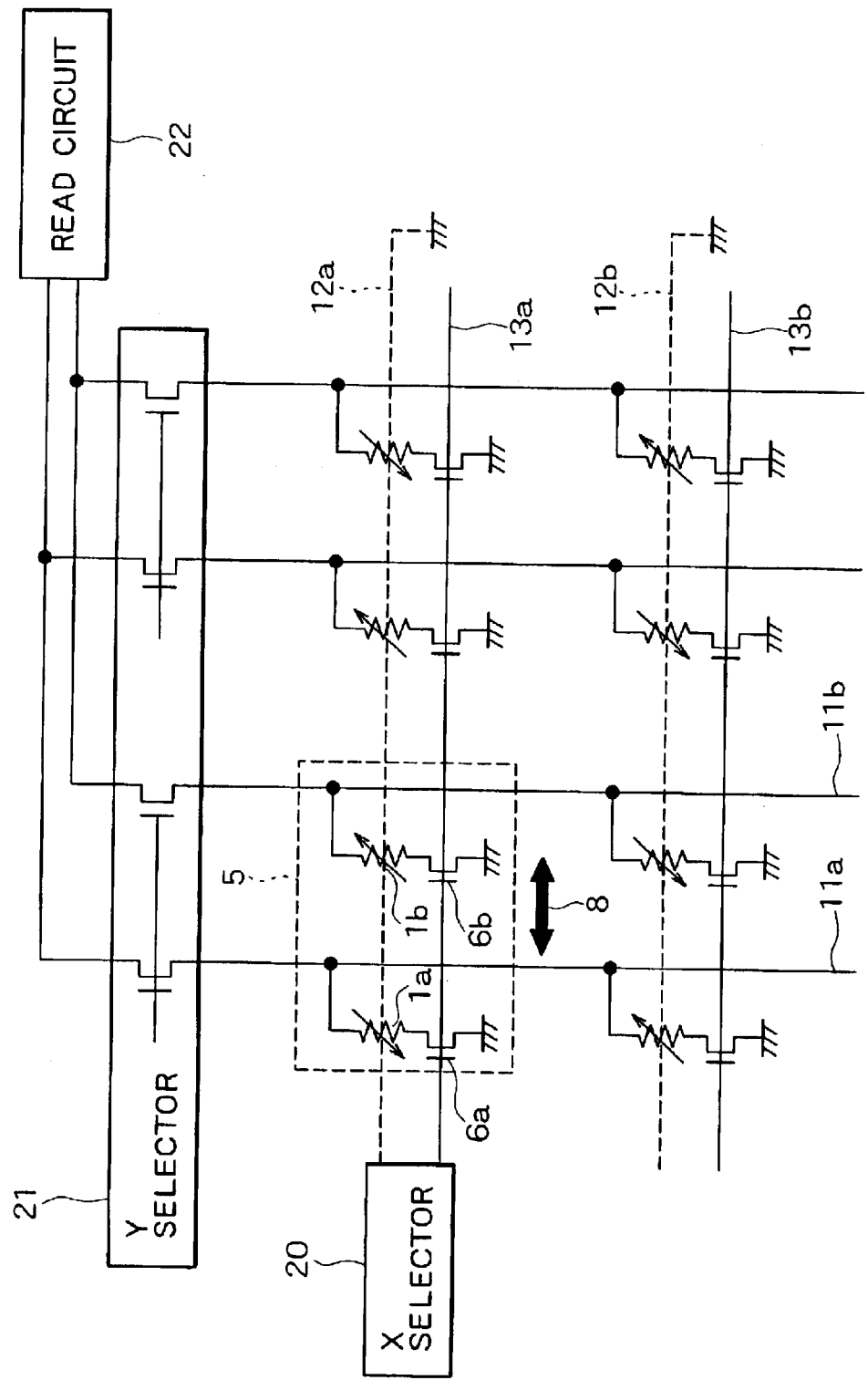
FIG. 4 is a diagram showing an MRAM (2T2R system) of a prior art example 1.
Figure 5A:
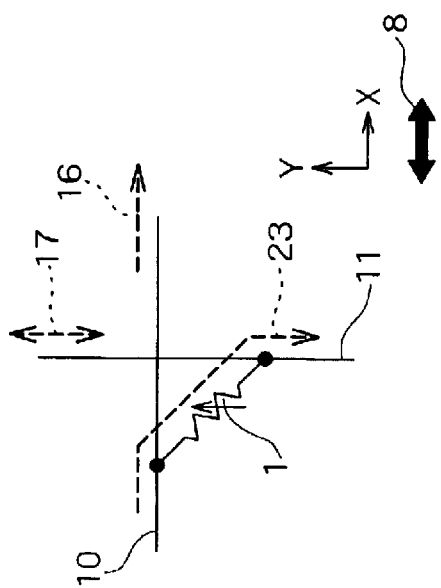
FIGS. 5A and 5B are views showing a structure of a memory cell of a prior art example 2.
Figure 5B:
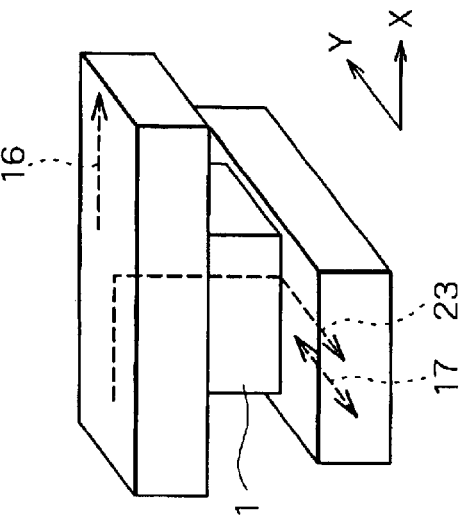

A unit cell 5 in the present invention is arranged at a point of intersection of a word line 10 and a bit line 11 orthogonal to each other as shown in FIGS. 5A and 5B and comprises TMR 1 connected to the word line 10 and the bit line 11. Further, a cell array is formed of a simple matrix in which the unit cells 5 are arranged in a matrix. In this case, the easy axis directions of magnetization of the respective TMRs 1 may be in a direction parallel to the word line 10 or may be in a direction parallel to the bit line 11. A reference line 47 is provided in the cell array as shown in FIG. 28 and a reference resistance 48 is connected between a word line 50 and the respective bit lines 11. Here, assuming that a resistance value of "0" in TMR 1 is R and a resistance value of "1" in TMR 1 is R+ΔR, the resistance value Rr of the reference resistance 48 is expressed by:

$$Rr=R+\Delta R/2 \quad \text{(expression 4)}$$

Figure 29:
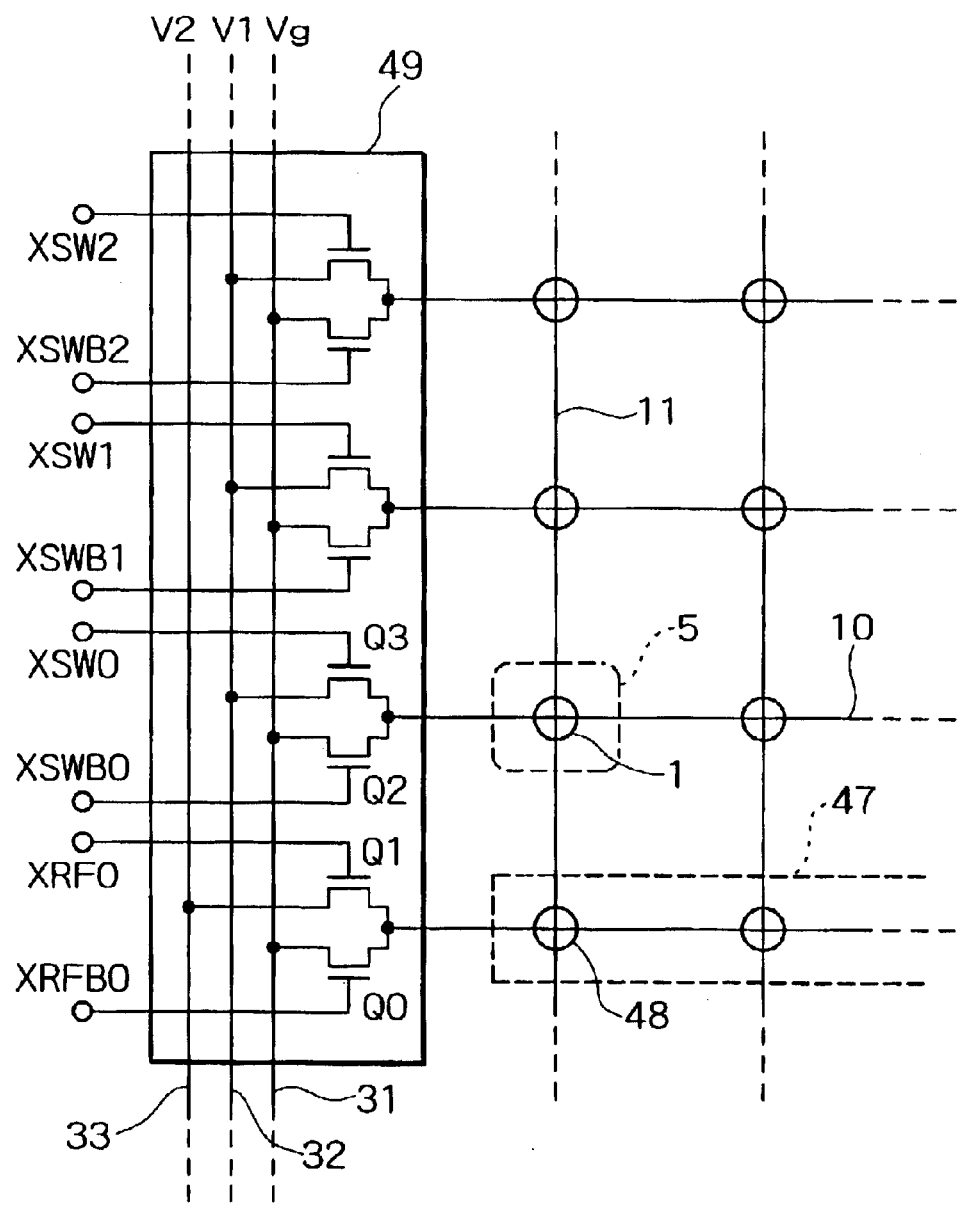
FIG. 29 is a diagram showing an X selector circuit example in the fifth embodiment.

Further, an X selector 49 and an X terminal circuit 35 are arranged at the ends of the respective word lines 10, and an Y selector 21 and an Y terminal circuit 36 are arranged at the ends of the respective bit lines 11. The X terminal circuit 35, Y selector 21 and Y terminal circuit 36 are formed of the circuits shown in FIG. 14, and the X selector 49 is formed of the circuit shown in FIG. 29. The X selector 49 controls the operation of selection or non-selection of the word lines 10, 50. For example, when the cell 5 in FIG. 29 is selected at the time of read, Q1 and Q3 are turned on and Q2 and Q4 are turned off so that the word line 10 is connected to the power source line 32 of V1 and the word line 50 in the reference line 47 is connected to the power source line 33 of V2. Further, other word lines are connected to the power source line 31 of Vg.

The write operation in the present invention is carried out as follows. In this case a description is performed using a case where the easy axes of magnetization of the respective TMRs 1 are uniformly parallel to the word line 10 and writing to the cell 5 shown in FIG. 28 is performed as an example. First, all word lines 10, 50 and bit lines 11 are connected to Vg by X terminal circuit 35 and Y terminal circuit 36. Then only a selective word line 10a is connected to the write circuit 42 by the X selector 49 and only the word line 10a is terminated to Vg by X terminal circuit 35. At this time non-selective word lines 10b to 10d are disconnected from the write circuits 42 and Vg. Also only a selective bit line 11a is connected to the write circuit 42 by the Y selector 21 and only the bit line 11a is terminated to Vg by Y terminal circuit 36. At this time non-selective bit lines 11b to 11d are disconnected from the write circuits 42 and Vg. Then write current 16 is passed through the word line 10a in an arbitrary direction and write current 17 is passed through the bit line 11a in a direction according to write information so that write is performed by a combined magnetic field formed by the write currents 16 and 17 on TMR 1.

The read operation in the present invention is performed as follows. Here, the description is performed using a case where the read of the cell 5 in FIG. 28 is carried out as an example. First, all word lines 10, 50 and bit lines 11 are connected to Vg by X terminal circuit 35 and Y terminal circuit 36. Then all word lines 10 and all bit lines 11 are disconnected from Vg by X terminal circuit 35 and Y terminal circuit 36. At this time a selective word line 10a is connected to the power source line 32 of V1 by the X selector 49 and other word lines 10b to 10d are connected to the power source line 31 of Vg. Further, the word line 50 in the reference line 47 is connected to the power source line 33 of V2. Also, a selective bit line 11a is connected to the read circuit 22 by the Y selector 21 and other bit lines 11b to 11d are connected to the power source line of Vg. Here the bit line 11a is a terminal virtually grounded to Vg. In this manner the cell 5 is selected and a voltage of (V1−Vg) is applied to only TMR 1 in the cell 5 on the selective bit line 11a. Further, a voltage of (Vg−V2) is applied to the reference cell 48. To the bit line 11a flows current Is of the difference between current I1 flowing to TMR 1 in the cell 5 and current Ir flowing to the reference cell 48 as expressed by the following expression.

$$Is=I1-Ir \quad \text{(expression 5)}$$

When the storage information in the cell 5 is "1", the sign of Is is minus due to the relation of I1<Ir. Further, the storage information in the cell 5 is "0", the sign of Is is plus due to the relation of I1>Ir. Namely, the storage information can be read by detecting a direction of the flow of Is. Accordingly, the read current 22 can be formed of such simple circuits as shown in FIG. 17 and the circuit surface area and power consumption can be reduced.

Figure 30:
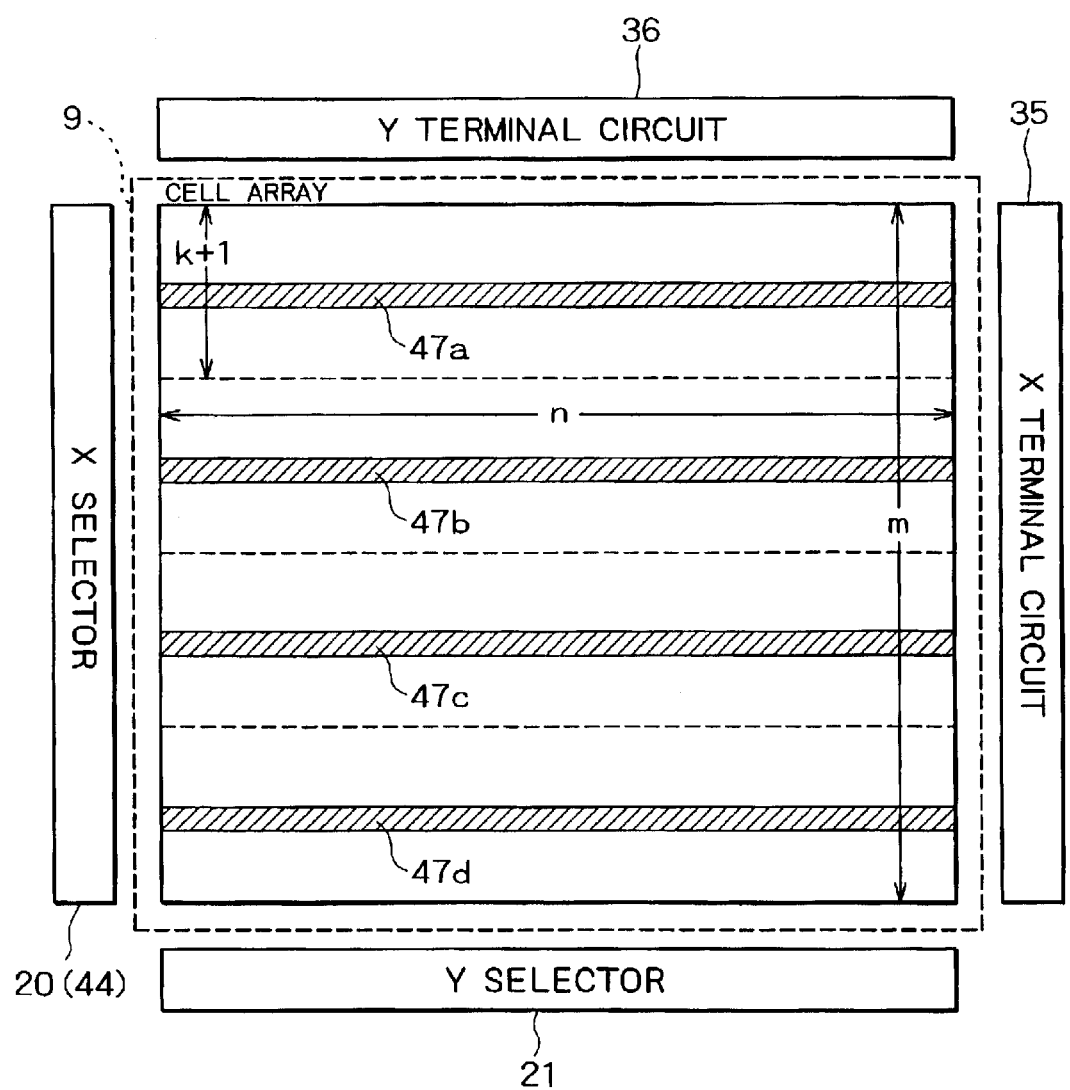
FIG. 30 is a view showing an example of a cell array in the fifth embodiment.

FIG. 30 is a concrete example of a cell array in the present invention, in which a plurality of reference lines 47 are arranged at fixed intervals in a cell array 9 to reduce the influence due to variation of resistance values of TMRs in their planes. Here, one reference line 47 every k word lines is arranged in (m×n) cell arrays 9, and when a cell in (k+1)×n regions shown in FIG. 30 is selected, a reference line 47 in the region is selected. Therefore, a reference cell, which belongs to a reference line nearest to the lines to which a cell for reading information belongs, and has a bit line together with the cell for reading information in common, is used for reading information.

The effects of the present invention are that the read circuit 22 can be easily formed so that its circuit surface area and power consumption can be reduced, and that the cell surface area can be set to ½ as compared with embodiments 1 to 4. Thus, according to the present invention, an array having higher density (large capacitance) can be formed. Further, in the present embodiment, peripheral circuits such as a selector, a terminal circuit and the like can be arranged below the layer of the cell array as shown in FIG. 9. Alternatively, in the present invention the array may be formed in such a manner that the cells are vertically laminated as shown in FIG. 27.

Figure 31:
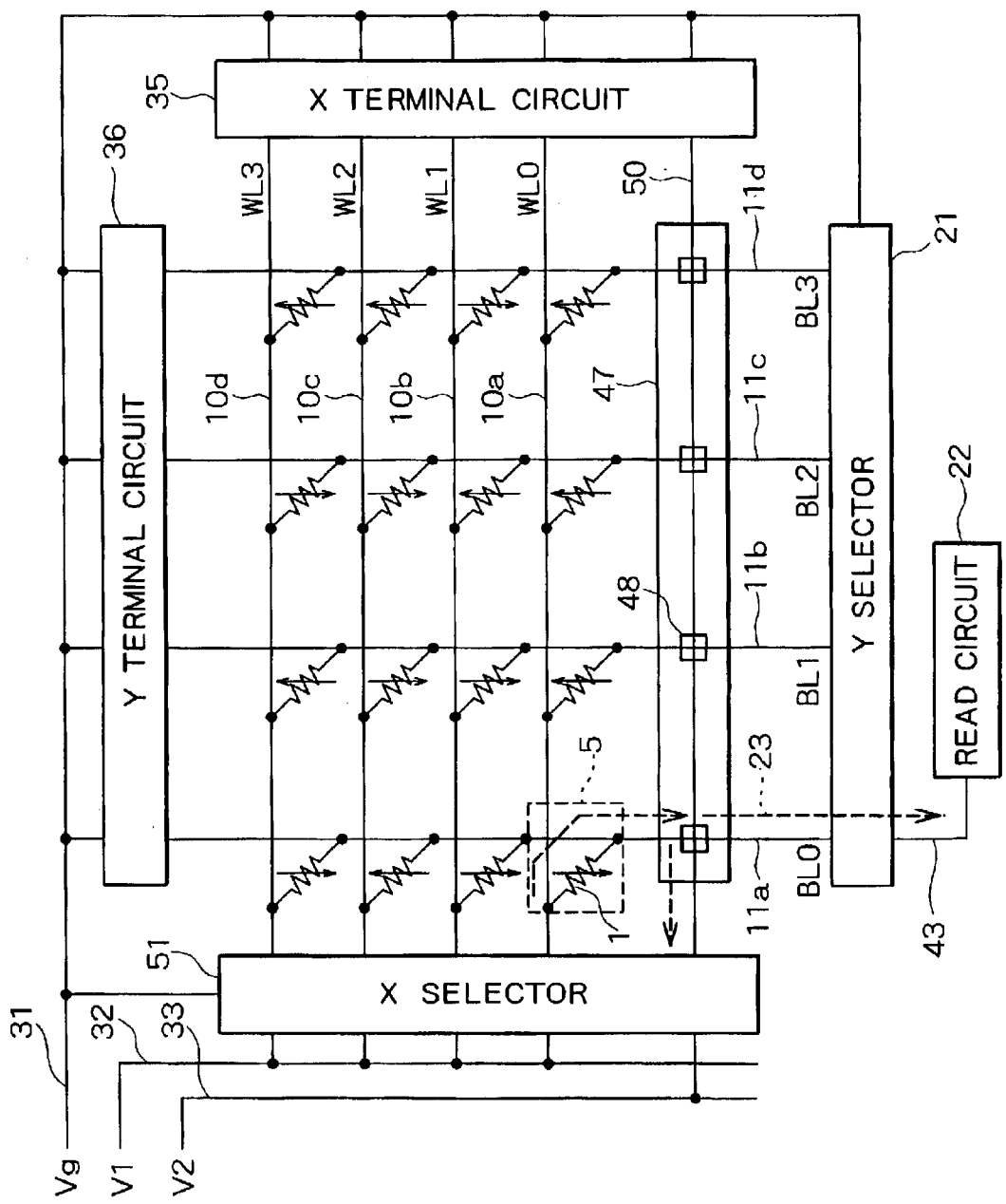
FIG. 31 is a diagram showing a sixth embodiment according to the present invention.

FIG. 31 is a circuit diagram showing a non-volatile memory according to a sixth embodiment of the present invention. In this case, the peripheral circuits such as a write circuit and the like are omitted for the sake of convenience in explanation.

Figure 32:
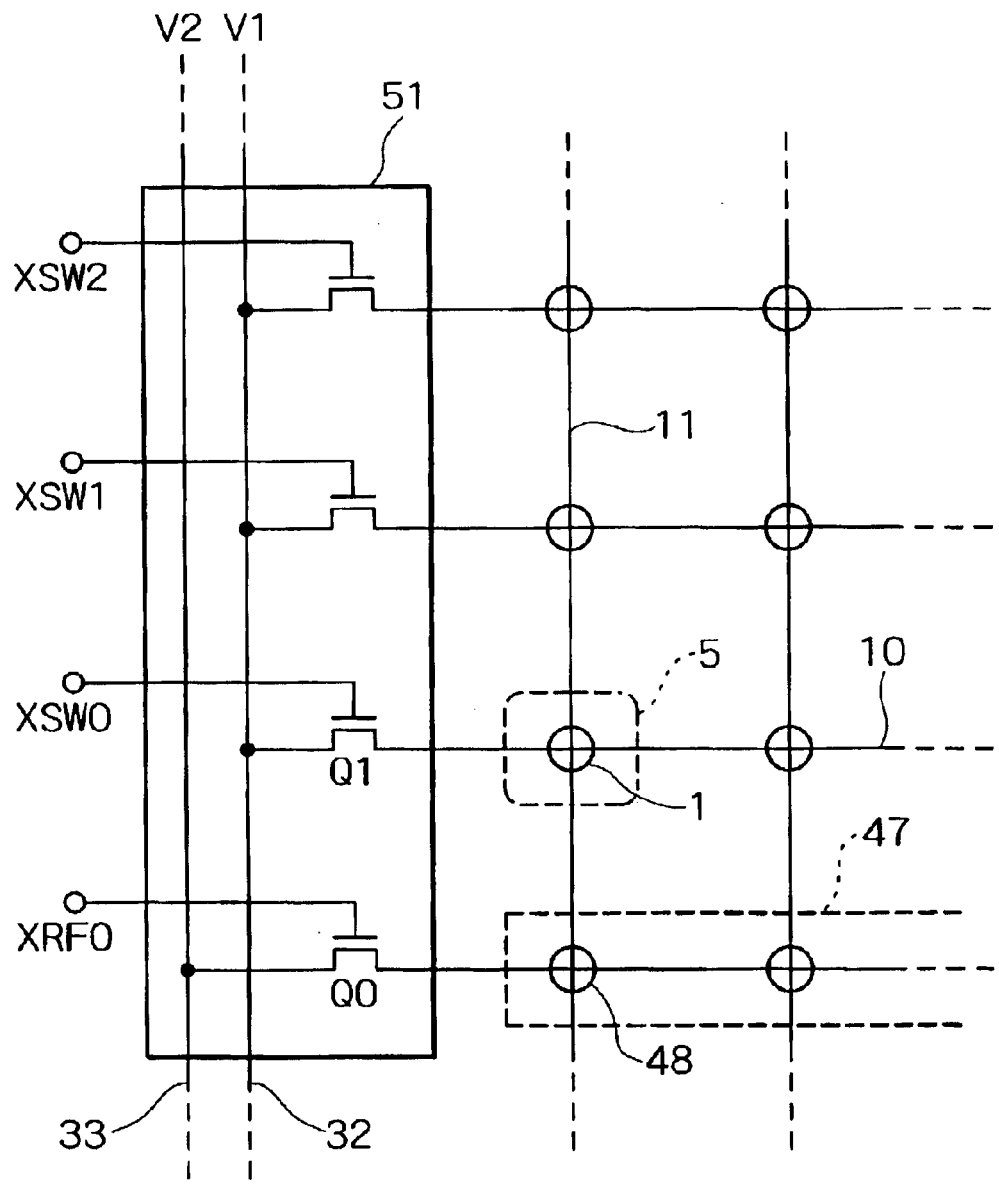
FIG. 32 is a diagram showing an X selector circuit example in the sixth embodiment.

The configuration of a cell and a cell array in the present invention are the same as in the fifth embodiment and the detailed explanation is omitted. Here, a reference line 47 is the same as that explained in the fifth embodiment and a reference cell 48 is a resistor having a resistance value Rr expressed by expression 4. It should be noted that such an X selector 51 as shown in FIG. 32 is used at the end of the respective word lines 10 in place of X selector 49. This X selector 51 controls the operations of the selection and non-selection of word lines 10, 50. For example, a cell 5 in FIG. 32 is selected at the time of read, Q0 and Q1 are turned on and other all transistors are tuned off so that the word line 10 is connected to the power source line 32 of V1 and the word line 50 in the reference line 47 is connected to the power source line 33 of V2. Further, the other word lines are released.

A write operation according to the present invention is the same as in the fifth embodiment and the detailed explanation is omitted.

A read operation according to the present invention is performed as follows. Here, the explanation of the read operation is carried out using a case where the read of the cell 5 in FIG. 31 is performed as an example. First, all word lines 10, 50 and bit lines 11 are connected to Vg by X terminal circuit 35 and Y terminal circuit 36. Then all word lines 10 and all bit lines 11 are disconnected from Vg by X terminal circuit 35 and Y terminal circuit 36. At this time a selective word line 10a is connected to the power source line 32 of V1 by X selector 51 and other word lines 10b to 10d are released. Further, the word line 50 in the reference line 47 is connected to the power source line 33 of V2. Also a selective bit line 11a is connected to a read circuit 22 and other bit lines 11b to 11d are connected to the power source line of Vg by Y selector 21. Here the bit line 11a is a terminal virtually grounded to Vg. Thus the cell 5 is selected and a voltage of (V1−Vg) is applied to only TMR 1 in the cell 5 on the selected bit line 11a. Further, a voltage of (Vg−V2) is applied to a reference cell 48. As described in embodiment 5, such current Is as shown in expression 5 is passed through the bit line 11a. The sign (direction) of Is is changed by the storage information of the cell 5 and read is performed by detecting the sign of Is. The read circuit 22 for detecting the sign of Is is formed of such a simple circuit as shown in FIG. 17 and the circuit surface area and the power consumption can be reduced.

The effects of the present invention are not only the simplification of the above-mentioned read circuit 22 but also that the cell surface area can be set to ½ as compared with embodiments 1 to 4. Thus, according to the present invention, an array having higher density (large capacitance) can be formed. Further, in the present invention, X selector can be formed more easily as compared with example 5 so that the circuit surface area can be made ½. Further, the number of signal lines from X decoder to X selector can be also made ½. Further, peripheral circuits such as a selector, a terminal circuit and the like can be arranged below the layer of the cell array as shown in FIGS. 19A, 19B. Alternatively, in the present embodiment the array may be formed in such a manner that the cells are vertically laminated as shown in FIG. 27.

Figure 33:
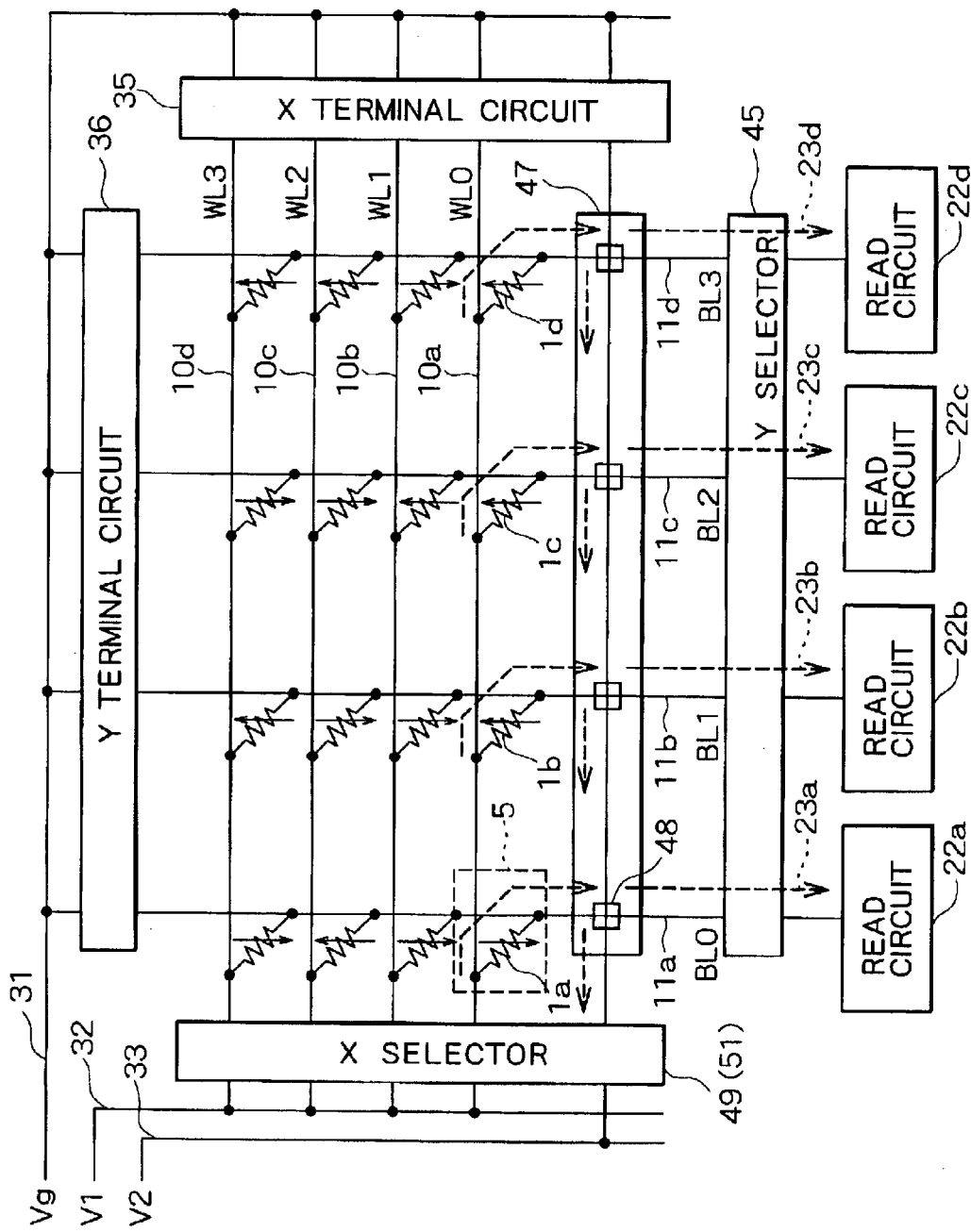
FIG. 33 is a diagram showing a seventh embodiment according to the present invention.

FIG. 33 is a circuit diagram showing a non-volatile memory according to a seventh embodiment of the present invention. In this case, the peripheral circuits such as a decoder, a write circuit and the like are omitted for the sake of convenience in explanation. The configuration of a cell and a cell array in the present embodiment are the same as in the example 5 and example 6 and the detailed explanation is omitted. Here as X selector an X selector 49 or 51 shown in FIG. 29 or FIG. 32 is used, and as Y selector a Y selector 45 shown in FIG. 26 is used. Further, a read circuit 22 is connected to respective bit lines 11 through Y selector 45.

The write operation according to the present invention is the same as in example 5 and the detailed explanation thereof is omitted.

In the read according to the present invention a plurality of cells connected to a selective word line are simultaneously selected as in the above-mentioned third embodiment and read currents Is passed through the respective bit lines 11 are input to the respective read circuits 22. Therefore, the cells on the selective word line can be read by one operation. Here the read will be described using a case where a cell on the word line 10a in FIG. 33 is selected as an example. First, all word lines 10, 50 and bit lines 11 are connected to Vg by X terminal circuit 35 and Y terminal circuit 36. Then all word lines 10 and all bit lines 11 are disconnected from Vg by X terminal circuit 35 and Y terminal circuit 36. Then when an X selector is an X selector 49 shown in FIG. 29, a selective word line 10a is connected to a power source line 32 of V1 and a word line 50 in a reference line 47 is connected to a power source line of V2. Further, other word lines 10b to 10d are connected to a power source line 31 of Vg. Further, when the X selector is an X selector 51 shown in FIG. 32, a selective word line 10a is connected to a power source line 32 of V1 and a word line 50 in a reference line 47 is connected to a power source line of V2. Further, other word lines 10b to 10d are released. At the same time when the above-mentioned operation is carried out, the respective bit lines 11a to 11d are connected to read circuits 22a to 22d by Y selector 45. The above-mentioned operation form a state where all cells on the word line 10a were selected. Directions of read currents Is passed through the respective bit lines 11a to 11d in accordance with information stored in respective TMRs 1a to 1d are detected by the respective read circuits 22a to 22d. Here since the read circuit 22 can be formed by such a simple circuit as shown in FIG. 17 and the circuit surface area thereof is small, a plurality of read cells can be arranged in one cell array. Thus, the read circuits 22 are arranged in parallel to each other and read is performed by one operation whereby substantial read time per one bit can be reduced.

Further, in the present invention peripheral circuits such as a selector, a terminal circuit and the like can be arranged below the layer of the cell array as shown in FIG. 19. Alternatively, in the present invention the array may be formed in such a manner that the cells are vertically laminated as shown in FIG. 27.

Although the examples of the present invention were described in detail with reference to drawings, embodied configurations are not limited to these examples and are included in this invention even if a change of design within a scope, which does not depart from the gist of this invention, is made. Further, it is clear that MRAM including a read method based on the above idea is in the scope of the present invention.

For example, regarding the cell array 9 including the idea of the present invention, the number of the word lines 10 and the number of the bit lines 11 are not limited. Further, a plurality of cell arrays 9 including the idea of the present invention are arranged so that the information of a selective cell in an arbitrary array may be read by one or a plurality of read circuits 22. Further, the integral circuit 39 may be not included in the read circuit 22 and a concrete circuit configuration is not limited to a configuration shown in FIG. 17.

As described above, according to this invention in a non-volatile magnetic memory using a tunnel magnetic resistance element, in spite of the fact that a transistor is not added to a memory cell the cell can be selected and stored information can be read without breaking the information.

Further, the cell size can be scaled irrespective of the process design rule containing the transistor and peripheral circuits such as a selector and the like can be arranged below a cell array. Thus vertical lamination of the cell array is easy and enhancement of the cell possession becomes easy.

Further, since in the read circuit the measuring of only a sign (direction) of current from a selective cell to be input is useful, a current measuring circuit or a resistance measuring circuit having high precision, which was indispensable in prior art, and a memory unit for storing the measured values can be removed.

Further, since the offset component of a read current value in a cell array can be completely removed, a circuit, which removes the offset current can be removed.

Further, in MRAMs described in embodiments 1 to 4, two magnetic resistance elements are complementarily read and the amount of signals become twice. Thus since it is not necessary to measure the read current values, the read time can be significantly reduced.

As described above, according to the read method of the present invention the read circuit can be easily formed and the circuit surface area can be reduced and also the power consumption can be reduced. Additionally, the read circuit can be arranged on the respective bit lines by these effects and the read by one operation can be performed.

What is claimed is:

1. A non-volatile magnetic memory comprising:
   a cell array including a plurality of unit cells arranged in a matrix, said unit cell including:
   a first word line;

a first memory element connected to said first word line and having an insulating film and at least two-layered ferromagnetic films provided so as to sandwich said insulating film therebetween, a second word line;

a second memory element connected to said second word line and having an insulating film and at least two-layered ferromagnetic films provided so as to sandwich said insulating film therebetween;

a bit line connected to said first memory element and said second memory element intersecting with said first word line and said second word line; and an information read part, which reads information from said first memory element and said second memory element by use of the fact that a tunnel electric current is changed by conditions of a direction of magnetization in said at least two-layered ferromagnetic films;

wherein the directions of easy axis of magnetization in said first memory element and said second memory element are the same as the direction of said bit line; and said first memory element and said second memory element store information opposite to each other.

2. The non-volatile magnetic memory according to claim 1, further comprising:

a first voltage applying part for applying an arbitrary voltage V1 to said first word line in the read unit cell at the time of read;

a second voltage applying part for applying an arbitrary voltage V2 different from said voltage V1 to said second word line in said read unit cell at the time of read;

a connecting part for applying a voltage Vg expressed by Vg=(V1+V2)/2 to said bit line in said read unit cell and connecting said bit line in said read unit cell to said information read part at the time of read; and a disconnecting part for disconnecting a word line in said cell array other than said first word line and said second word line in said read unit cell and a bit line in said cell array other than said bit line in said read unit cell from said information read part at the time of read;

wherein said information read part reads information written in said read unit cell by detecting a direction of electric current, which flows into said bit line in said read unit cell.

3. The non-volatile magnetic memory according to claim 2 further comprising:

a first wiring having said voltage V1;

a second wiring having said voltage V2;

a third wiring having said voltage Vg; and a connecting part for connecting a bit line in said cell array other than said bit line in said read unit cell to said third wiring at the time of read;

wherein said first voltage applying part connects said first word line in said read unit cell to said first wiring, and said second voltage applying part connects said second word line in said read unit cell to said second wiring.

4. The non-volatile magnetic memory according to claim 1, further comprising:

a first voltage applying part for applying an arbitrary voltage V1 to said first word line in a read unit cell at the time of read;

a second voltage applying part for applying an arbitrary voltage V2 different from said voltage V1 to said second word line in said read unit cell at the time of read;

a connecting part for applying a voltage Vg expressed by Vg=(V1+V2)/2 to said bit line in said read unit cell and connecting said bit line in said read unit cell to said information read part at the time of read;

an opening part for opening a word line in said cell array other than said first word line and said second word line in said read unit cell at the time of read; and a disconnecting part for disconnecting a bit line in said cell array other than said bit line in said read unit cell from said information read part at the time of read;

wherein said information read part reads information written in said read unit cell by detecting a direction of electric current, which flows into said bit line in said read unit cell.

5. The non-volatile magnetic memory according to claim 4 further comprising:

a first wiring having said voltage V1; and a second wiring having said voltage V2;

wherein said first voltage applying part connects said first word line in said read unit cell to said first wiring, and said second voltage applying part connects said second word line in said read unit cell to said second wiring.

6. The non-volatile magnetic memory according to claim 1, wherein said information read part is provided in every bit line and information is simultaneously read from a plurality of unit cells connected to the same word line.

7. The non-volatile magnetic memory according to claim 1, further comprising:

an information write part for passing electric current in bi-direction different from both said first word line and said second word line in a read unit cell.

8. A non-volatile magnetic memory comprising:

a cell array including a plurality of unit cells arranged in a matrix, and a plurality of reference cells arranged in a line, said unit cell including:

a word line;

a memory element connected to said word line and having an insulating film and at least two-layered ferromagnetic films provided so as to sandwich said insulating film therebetween;

a bit line connected to said memory element and intersecting with said word line, said reference cell including:

a word line;

a resistance element connected to said word line; and a bit line connected to said resistance element and intersecting with said word line, and an information read part, which reads information from said memory element by use of the fact that a tunnel electric current is changed by the conditions of a direction of magnetization in said at least two-layered ferromagnetic films;

wherein the direction of easy axis of magnetization in said memory element is the same as the direction of said bit line.

9. The non-volatile magnetic memory according to claim 8, wherein a resistance value of said resistance element is an intermediate value between a resistance value in the conditions where said memory element stores "0" and a resistance value in the conditions where said memory element stores "1".

10. The non-volatile magnetic memory according to claim 8, wherein said cell array includes a plurality of reference lines each having said plurality of reference cells; and the reference cell having both a read unit cell and a bit line and belonging to said reference line, which is nearest to the line to which said read unit cell belongs, is utilized for the read of information from said read unit cell.

11. The non-volatile magnetic memory according to claim 8, further comprising:

a first voltage applying part for applying an arbitrary voltage V1 to said word line in a read unit cell at the time of read;

a second voltage applying part for applying an arbitrary voltage V2 different from said voltage V1 to said word line in an usage reference cell at the time of read;

a connecting part for applying a voltage Vg expressed by Vg=(V1+V2)/2 to said bit line of both said read unit cell and said usage reference cell and connecting a bit line of both said read unit cell and said usage reference cell to said information read part at the time of read;

a disconnecting part for disconnecting a word line in said cell array other than said word line in said read unit cell and said word line in said usage reference cell, and a bit line in said cell array other than the bit lines of both said read unit cell and said usage reference cell from said information read part at the time of read;

wherein said information read part reads information written in said read unit cell by detecting a direction of electric current, which flows into a bit line of both said read unit cell and said usage reference cell.

12. The non-volatile magnetic memory according to claim 11 further comprising:

a first wiring having said voltage V1;

a second wiring having said voltage V2;

a third wiring having said voltage Vg; and a connecting part for connecting a bit line in said cell array other than said bit line of both said read unit cell and said usage reference cell to said third wiring at the time of read;

wherein said first voltage applying part connects said word line in said read unit cell to said first wiring, and said second voltage applying part connects said word line in said usage reference cell to said second wiring.

13. The non-volatile magnetic memory according to claim 8, further comprising:

a first voltage applying part for applying an arbitrary voltage V1 to said word line in a read unit cell at the time of read;

a second voltage applying part for applying an arbitrary voltage V2 different from said voltage V1 to said word line in an usage reference cell at the time of read;

a connecting part for applying a voltage Vg expressed by Vg=(V1+V2)/2 to said bit line of both said read unit cell and said usage reference cell and connecting said bit line of both said read unit cell and said usage reference cell to said information read part at the time of read;

an opening part for opening a word line in said cell array other than said word line in said read unit cell and said word line in said usage reference cell at the time of read; and a disconnecting part for disconnecting a bit line in said cell array other than said bit line of both said read unit cell and said usage reference cell from said information read part at the time of read;

wherein said information read part reads information written in said read unit cell by detecting a direction of electric current, which flows into said bit line of both said read unit cell and said usage reference cell.

14. The non-volatile magnetic memory according to claim 13 further comprising:

a first wiring having said voltage V1; and a second wiring having said voltage V2;

wherein said first voltage applying part connects said word line in said read unit cell to said first wiring, and said second voltage applying part connects said word line in said usage reference cell to said second wiring.

15. The non-volatile magnetic memory according to claim 8, wherein said information read part is provided in every bit line and information is simultaneously read from a plurality of unit cells connected to the same word line.

16. The non-volatile magnetic memory according to claim 2, wherein said memory includes a voltage source, which produces said voltage V1, said voltage V2 and said voltage Vg.

17. The non-volatile magnetic memory according to claim 4, wherein said memory includes a voltage source, which produces said voltage V1, said voltage V2 and said voltage Vg.

18. The non-volatile magnetic memory according to claim 11, wherein said memory includes a voltage source, which produces said voltage V1, said voltage V2 and said voltage Vg.

19. The non-volatile magnetic memory according to claim 13, wherein said memory includes a voltage source, which produces said voltage V1, said voltage V2 and said voltage Vg.

20. The non-volatile magnetic memory according to claim 2, wherein said memory includes a terminal circuit for connecting all word lines and all bit lines to a wiring of said voltage Vg at the time other than the time of read and the time of write.

21. The non-volatile magnetic memory according to claim 4, wherein said memory includes a terminal circuit for connecting all word lines and all bit lines to a wiring of said voltage Vg at the time other than the time of read and the time of write.

22. The non-volatile magnetic memory according to claim 11, wherein said memory includes a terminal circuit for connecting all word lines and all bit lines to a wiring of said voltage Vg at the time other than the time of read and the time of write.

23. The non-volatile magnetic memory according to claim 13, wherein said memory includes a terminal circuit for connecting all word lines and all bit lines to a wiring of said voltage Vg at the time other than the time of read and the time of write.

24. The non-volatile magnetic memory according to claim 2, wherein said memory includes a terminal circuit for connecting said first word line and said second word line in a selection unit cell and a bit line in said selection unit cell to a wiring having said voltage Vg, and disconnecting other word lines and other bit lines in said cell array from a wiring having said voltage Vg at the time of write.

25. The non-volatile magnetic memory according to claim 4,
wherein said memory includes a terminal circuit for connecting said first word line and said second word line in a selection unit cell and a bit line in said selection unit cell to a wiring having said voltage Vg, and disconnecting other word lines and other bit lines in said cell array from a wiring having said voltage Vg at the time of write.

26. The non-volatile magnetic memory according to claim 11,
wherein said memory includes a terminal circuit for connecting said word line in said selection unit cell, said word line in said usage reference cell and a bit line of both said selection unit cell and said usage reference cell to a wiring having said voltage Vg, and disconnecting other word lines and other bit lines in said cell array from a wiring having said voltage Vg at the time of write.

27. The non-volatile magnetic memory according to claim 13,
wherein said memory includes a terminal circuit for connecting said word line in said selection unit cell, said word line in said usage reference cell and a bit line of both said selection unit cell and said usage reference cell to a wiring having said voltage Vg, and disconnecting other word lines and other bit lines in said cell array from a wiring having said voltage Vg at the time of write.

28. The non-volatile magnetic memory according to claim 2,
wherein said memory includes a terminal circuit for disconnecting all word lines and all bit lines in said cell array from a wiring having said voltage Vg at the time of read.

29. The non-volatile magnetic memory according to claim 4,
wherein said memory includes a terminal circuit for disconnecting all word lines and all bit lines in said cell array from a wiring having said voltage Vg at the time of read.

30. The non-volatile magnetic memory according to claim 11,
wherein said memory includes a terminal circuit for disconnecting all word lines and all bit lines in said cell array from a wiring having said voltage Vg at the time of read.

31. The non-volatile magnetic memory according to claim 13,
wherein said memory includes a terminal circuit for disconnecting all word lines and all bit lines in said cell array from a wiring having said voltage Vg at the time of read.

32. The non-volatile magnetic memory according to claim 1, further comprising:
a first write circuit;
a second write circuit;
an X selector circuit for connecting a first word line and a second word line in a write unit cell to said first write circuit, and opening word lines in said cell array other than said first word line and said second word line in said write unit cell at the time of write; and
a Y selector circuit for connecting a bit line in said write unit cell to said second write circuit, and opening bit lines in said cell array other than said bit line in said write unit cell at the time of write.

33. The non-volatile magnetic memory according to claim 8, further comprising:
a first write circuit;
a second write circuit;
an X selector circuit for connecting a word line in a write unit cell to said first write circuit, and opening word lines in said cell array other than said word line in said write unit cell at the time of write; and
a Y selector circuit for connecting a bit line in said write unit cell to said second write circuit, and opening bit lines in said cell array other than said bit line in said write unit cell at the time of write.

34. The non-volatile magnetic memory according to claim 2,
wherein said memory includes a connecting part for connecting a wiring having said voltage Vg to the bit lines in said cell array other than the bit line in said read unit cell at the time of read.

35. The non-volatile magnetic memory according to claim 4,
wherein said memory includes a connecting part for connecting a wiring having said voltage Vg to the bit lines in said cell array other than the bit line in said read unit cell at the time of read.

36. The non-volatile magnetic memory according to claim 11,
wherein said memory includes a connecting part for connecting a wiring having said voltage Vg to the bit lines in said cell array other than the bit line in said read unit cell at the time of read.

37. The non-volatile magnetic memory according to claim 13,
wherein said memory includes a connecting part for connecting a wiring having said voltage Vg to the bit lines in said cell array other than the bit line in said read unit cell at the time of read.

38. The non-volatile magnetic memory according to claim 2,
wherein said information read part including:
an integrating part for integrating electric current, which flows into the bit line in said read unit cell;
a current-voltage converting part for converting an output signal of said integrating part to voltage; and
a comparison part for comparing an output voltage of said current-voltage converting part with said voltage Vg.

39. The non-volatile magnetic memory according to claim 4,
wherein said information read part including:
an integrating part for integrating electric current, which flows into the bit line in said read unit cell;
a current-voltage converting part for converting an output signal of said integrating part to voltage; and
a comparison part for comparing an output voltage of said current-voltage converting part with said voltage Vg.

40. The non-volatile magnetic memory according to claim 11,
wherein said information read part including:
an integrating part for integrating electric current, which flows into the bit line in said read unit cell;

a current-voltage converting part for converting an output signal of said integrating part to voltage; and a comparison part for comparing an output voltage of said current-voltage converting part with said voltage Vg.

41. The non-volatile magnetic memory according to claim 13, wherein said information read part including:

an integrating part for integrating electric current, which flows into the bit line in said read unit cell;

a current-voltage converting part for converting an output signal of said integrating part to voltage; and a comparison part for comparing an output voltage of said current-voltage converting part with said voltage Vg.

42. The non-volatile magnetic memory according to claim 1, wherein said cell array and other component are superimposed.

* * * * *